US012336361B2

(12) United States Patent
Rivnay et al.

(10) Patent No.: US 12,336,361 B2
(45) Date of Patent: Jun. 17, 2025

(54) VERTICAL ORGANIC ELECTROCHEMICAL TRANSISTOR PAIRS

(71) Applicant: Northwestern University, Evanston, IL (US)

(72) Inventors: Jonathan Rivnay, Chicago, IL (US); Reem B. Rashid, Chicago, IL (US); Robert J. Ciechowski, Glendale Heights, IL (US)

(73) Assignee: Northwestern University, Evanston, IL (US)

( * ) Notice: Subject to any disclaimer, the term of this patent is extended or adjusted under 35 U.S.C. 154(b) by 500 days.

(21) Appl. No.: 17/907,852

(22) PCT Filed: Mar. 5, 2021

(86) PCT No.: PCT/US2021/021023
§ 371 (c)(1),
(2) Date: Aug. 29, 2022

(87) PCT Pub. No.: WO2021/178757
PCT Pub. Date: Sep. 10, 2021

(65) Prior Publication Data
US 2023/0094869 A1 Mar. 30, 2023

Related U.S. Application Data

(60) Provisional application No. 62/985,640, filed on Mar. 5, 2020, provisional application No. 62/985,620, filed on Mar. 5, 2020.

(51) Int. Cl.
*H10K 10/46* (2023.01)
*G01N 27/414* (2006.01)

(52) U.S. Cl.
CPC ......... *H10K 10/491* (2023.02); *G01N 27/414* (2013.01)

(58) Field of Classification Search
CPC .................................................. H10K 10/491
See application file for complete search history.

(56) References Cited

U.S. PATENT DOCUMENTS 10,388,874 B2 * 8/2019 Rivnay ............ H01L 21/76832
2009/0040587 A1    2/2009 Kugler
(Continued)

FOREIGN PATENT DOCUMENTS

CN    116634779 A  *  8/2023
CN    117279398 A  * 12/2023
(Continued)

OTHER PUBLICATIONS

"Complementary integration of organic electrochemical transistors for front-end amplifier circuits of flexible neural implants" to Uguz et al. (Year: 2024).*
(Continued)

*Primary Examiner* — Evren Seven
(74) *Attorney, Agent, or Firm* — BELL & MANNING, LLC

(57) ABSTRACT

Cofacial vertical organic electrochemical transistor (vOECT) pairs, electronic circuits into which the vOECT pairs are integrated, and methods for fabricating the vOECT pairs are provided. The vOECTs pairs are formed from a vertically stacked structure that includes a first layer of an electrically conducting material, a first layer of an electrically insulating material, and a second layer of an electrically conducting material. The vOECTs of the pairs are formed on opposing sidewalls of a trench formed in the stacked structure.

22 Claims, 14 Drawing Sheets

(56) References Cited

U.S. PATENT DOCUMENTS

| | | |
|---|---|---|
| 2010/0283042 A1 | 11/2010 | Katz et al. |
| 2012/0081774 A1 | 4/2012 | De Paiva Martins et al. |
| 2015/0155430 A1 | 6/2015 | Li |
| 2018/0323406 A1 | 11/2018 | Li |
| 2025/0063880 A1* | 2/2025 | Rivnay ................ H10K 10/491 |

FOREIGN PATENT DOCUMENTS

| | | | |
|---|---|---|---|
| CN | 118524713 A * | 8/2024 | |
| WO | WO-2017109734 A1 * | 6/2017 | ......... H01L 51/0562 |

OTHER PUBLICATIONS

The International Search Report and the Written Opinion issued on Jul. 19, 2021 for international patent application No. PCT/US2021/21023; pp. 1-11.

Mary J. Donahue et al., "High Performance Vertical Organic Electrochemical Transistors," Wiley-VCH (2018); pp. 1-12.

Hengda Sun et al., "Complementary Logic Circuits Based on High-Performance n-Type Organic Electrochemical Transistors," *Advanced Materials* 2018, vol. 30, 1704916 (1 of 7).

Jonathan Rivnay et al., "Organic electrochemical transistors," *Nature Reviews—Materials* 2018, vol. 3, Article No. 17086; pp. 1-14.

Reem B. Rashid et al., "Self-aligned, laser-cut organic electrochemical transistors," *Flex. Print. Electron.* (2020), vol. 5, 014007; pp. 1-8. https://doi.org/10.1068/2058-8585/ab63al.

Yuanying Liang—Thesis—"Interdigitated Organic Electrochemical Transistors for Biosensing," Nov. 18, 2019; pp. 1-120.

Hocheon Yoo et al., "Highly stacked 3D organic integrated circuits with via-hole-less multilevel metal interconnects," *Nature Communications* (2019) 10:2424; pp. 1-9. https://doi.org/10.1038/341467-019-10412-9.

Tanmoy Das et al., "Highly Flexible Hybrid CMOS Inverter Based on Si Nanomembrane and Molybdenum Disulfide," *small* 2016, vol. 12, No. 41; pp. 5720-5727.

Vishak Venkatraman et al., "Subthreshold Operation of Organic Electrochemical Transistors for Biosignal Amplification," *Advanced Science* 2018, vol. 5, 1800453 (1 of 7).

Paolo Romele et al., "Multiscale real time and high sensitivity ion detection with complementary organic electrochemical transistors amplifier," *Nature Communications* (2020) 11:3743. https//doi.org/10.1038/s41467-020-17547-0.

* cited by examiner

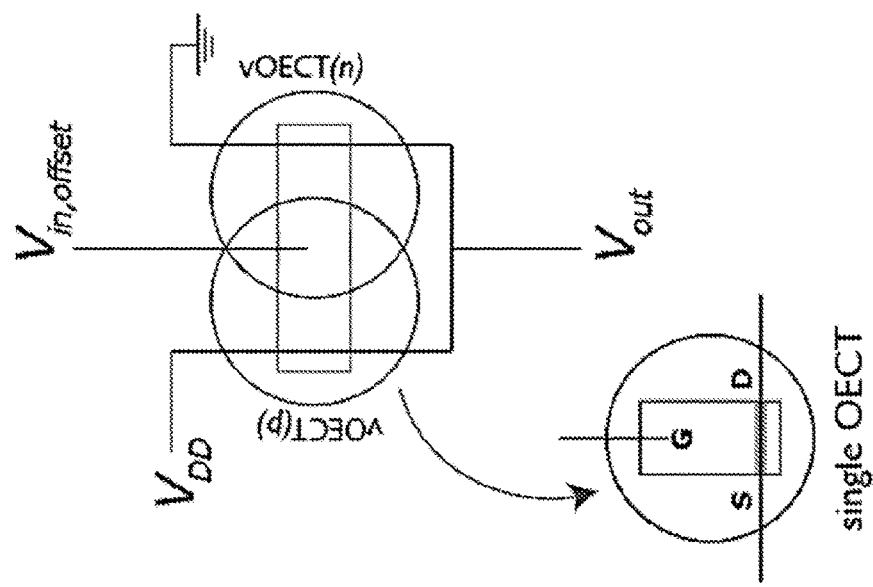
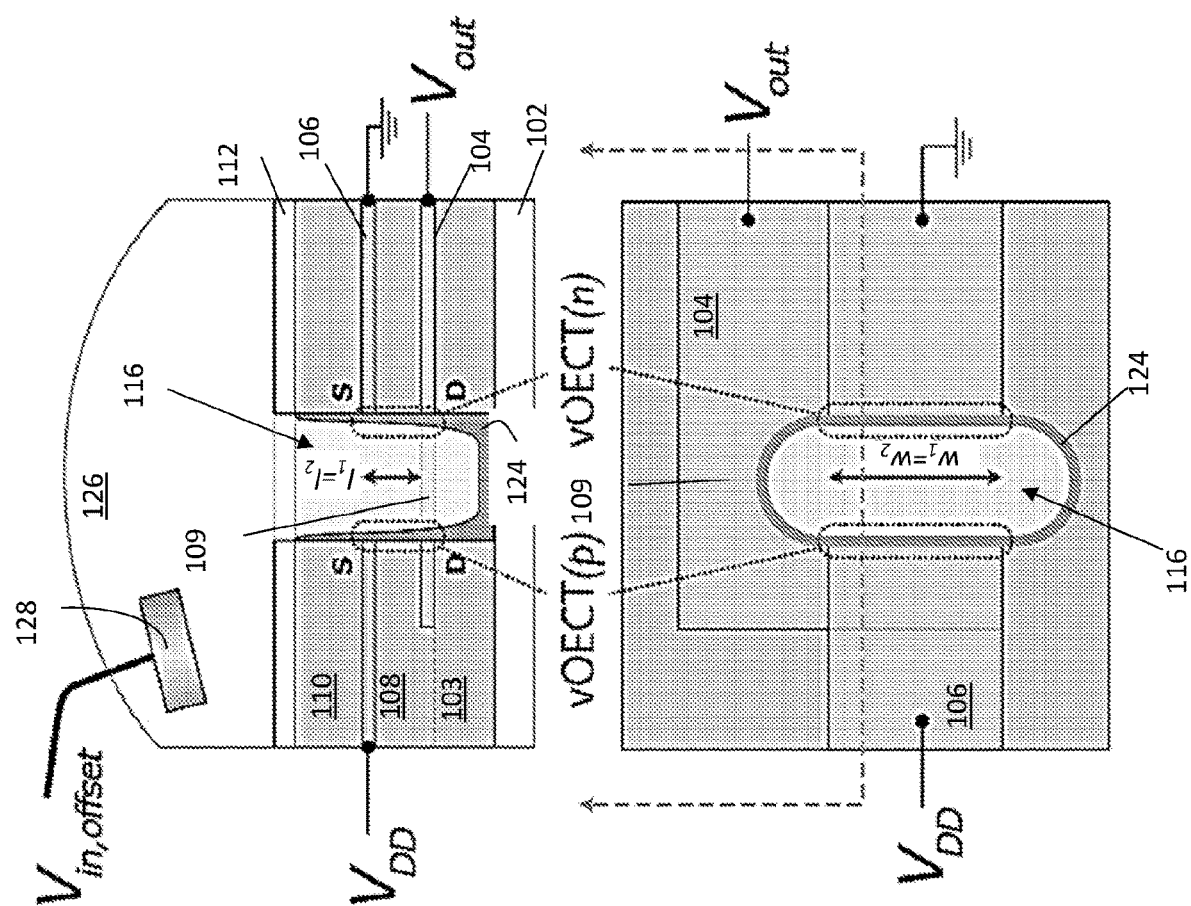
FIG. 2

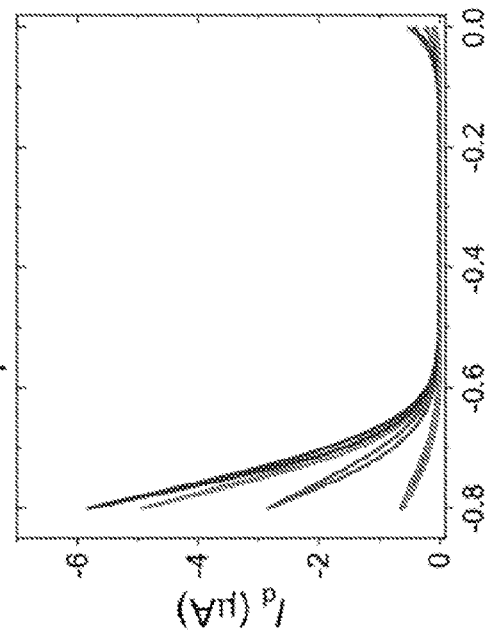
FIG. 6C
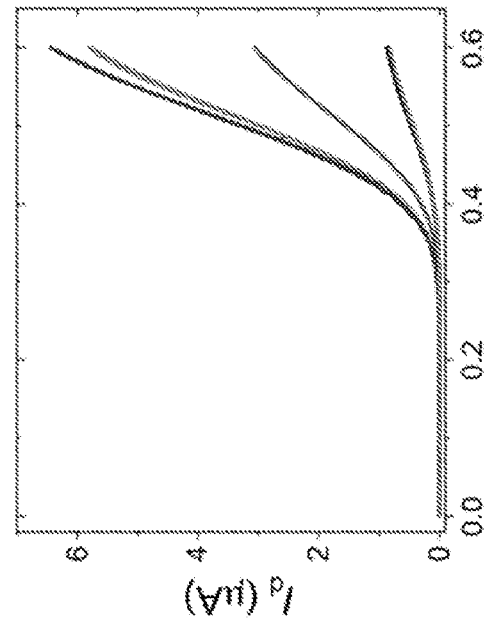
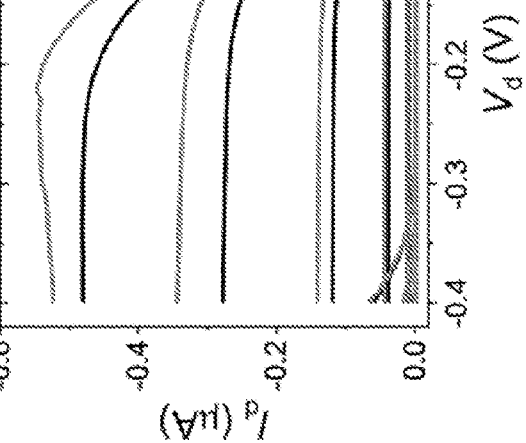
FIG. 6D
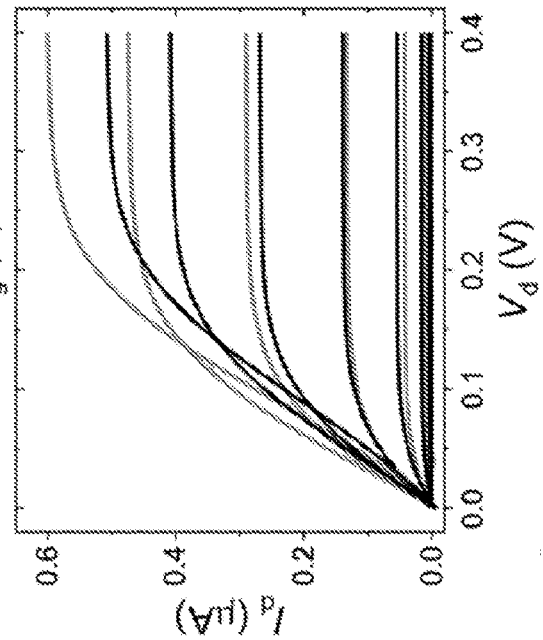

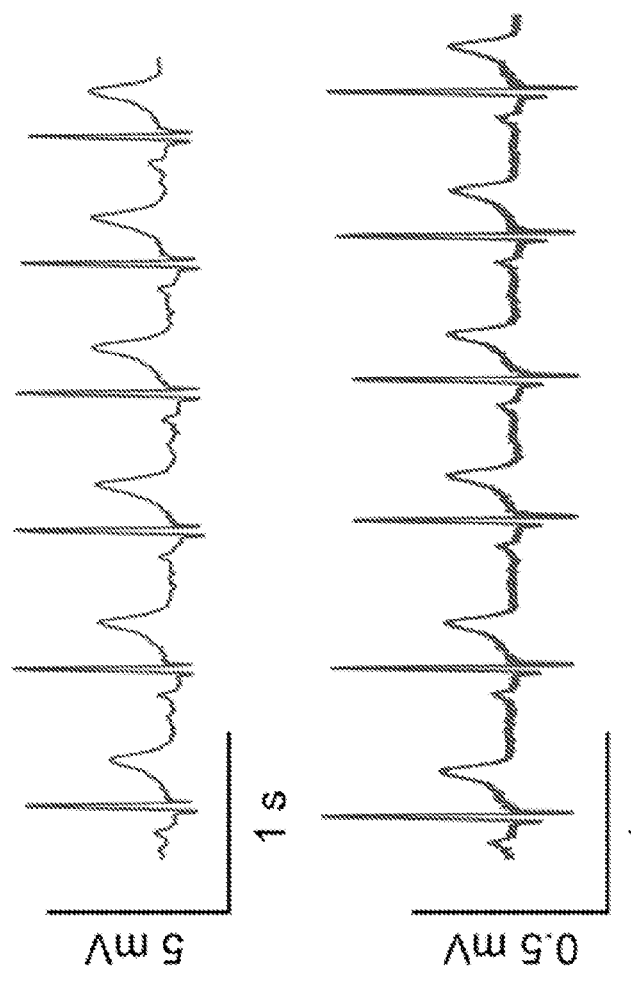
FIG. 8A
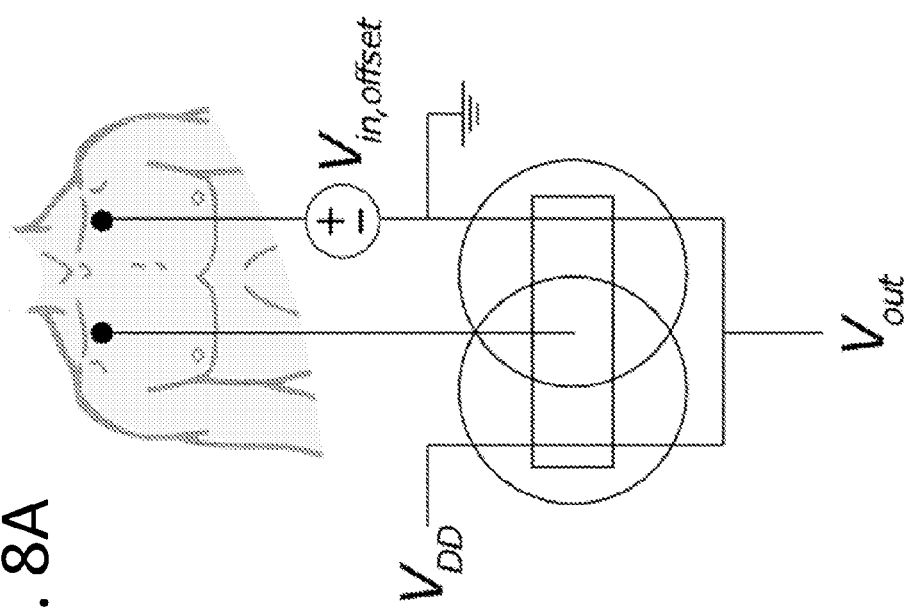
FIG. 8B
FIG. 8C

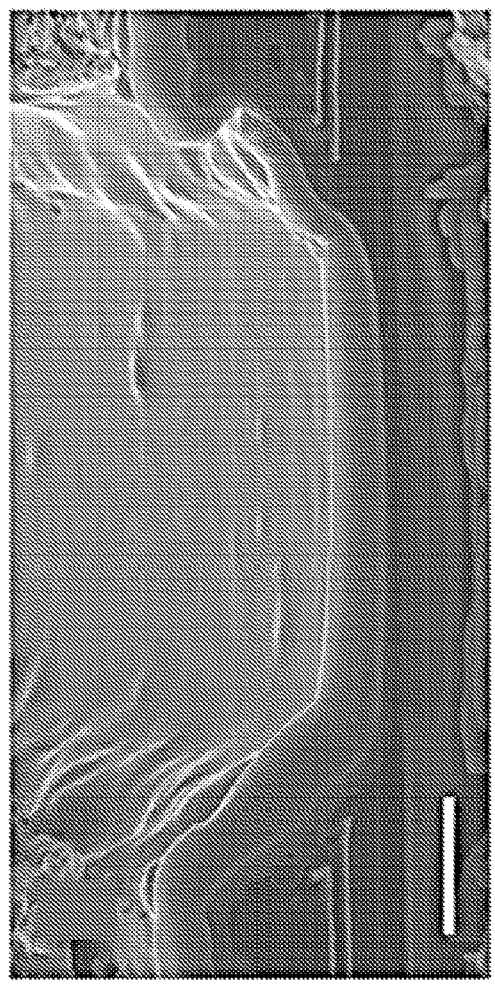
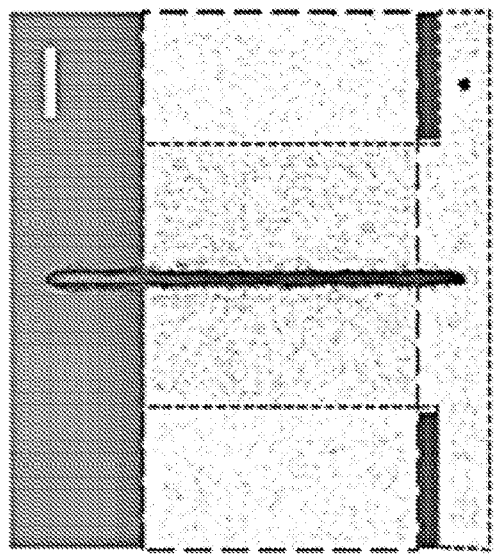
FIG. 9B
FIG. 9A

VERTICAL ORGANIC ELECTROCHEMICAL TRANSISTOR PAIRS

CROSS-REFERENCE TO RELATED APPLICATIONS

The present application is a National Stage of International Application No. PCT/US21/21023, filed Mar. 5, 2021, which claims priority to U.S. provisional patent application No. 62/985,620 that was filed Mar. 5, 2020 and U.S. provisional patent application No. 62/985,640 filed Mar. 5, 2020, the entire contents of both of which are incorporated herein by reference.

REFERENCE TO GOVERNMENT RIGHTS

This invention was made with government support under HD073945 awarded by the National Institutes of Health (NIH). The government has certain rights in the invention.

BACKGROUND

Organic electrochemical transistors (OECTs) have gained attention for their use as effective switches and sensor devices that take advantage of bulk transport of ionic/electronic species in the active channel material and lead to high amplification. Their mixed transport, operation in electrolyte, and compatibility with flexible substrates make them suitable for biological applications. Traditional OECTs have a planar configuration, meaning the source and drain terminals lay on the same plane; however, vertical OECTs (vOECTs) may result in better electrical properties, such as higher transconductance and cutoff frequency, due to their potentially shorter channel lengths. Additionally, vOECTs allow for a more compact form factor. Previous work has been successful in fabricating vOECTs but has made use of traditional photolithography to define the opening of the channel, which creates active material on contacts—a source of parasitic capacitance. This overlap causes, amongst other issues, a slow response time in these devices, and thus the full potential for vOECTs has not yet been reached.

Complementary inverters have the potential to be used as low-power high-gain pre-amplifiers but face compatibility issues with biological environments. A complementary inverter based on a pair of planar OECTs has been proposed. (Sun, et al. "Complementary Logic Circuits Based on High-Performance n-Type Organic Electrochemical Transistors." *Advanced Materials* 30.9 (2018): 1704916.) However, in this OECT-based complementary inverter, holes and electrons are transported in different p-type and n-type semiconductor active materials, which need to be patterned into separate channels. This leads to additional fabrication demands. In addition, the use of planar OECTs in the complementary pair takes up valuable real estate and limits the ability to scale down the devices.

SUMMARY

Cofacial vertical organic electrochemical transistor pairs, electronic circuits incorporating the cofacial vertical organic electrochemical transistor pairs, and methods for fabricating the cofacial vertical organic electrochemical transistor pairs are provided.

One embodiment of a cofacial vertical organic electrochemical transistor pair includes a vertically stacked structure comprising: a first layer of electrically conducting material; a second layer of electrically conducting material; and a layer of electrically insulating material separating the first layer of electrically conducting material from the second layer of electrically conducting material. A trench extends vertically through the vertically stacked structure, wherein the trench bisects one or both of the first and second layers of electrically conducting material. The cofacial vertical organic electrochemical transistor pair further includes a film of active material in the trench, wherein the film of active material spans the first and second layers of electrically conducting material on a first side of the trench and spans the first and second layers of electrically conducting material on an opposing side of the trench; an electrolyte at least partially filling the trench; and a gate electrode in contact with the electrolyte.

Complementary inverters and differential pairs are two examples of the types of circuits into which the cofacial vertical organic electrochemical transistor pairs can be incorporated as active components.

One embodiment of a complementary inverter includes a vertically stacked structure comprising: a first layer of electrically conducting material; a second layer of electrically conducting material; and a layer of electrically insulating material separating the first layer of electrically conducting material from the second layer of electrically conducting material. A trench extends vertically through the vertically stacked structure, wherein the trench bisects the first layer of electrically conducting material, but does not bisect the second layer of electrically conducting material. The inverter further includes: a film of active material in the trench, wherein the film of active material spans the first and second layers of electrically conducting material on a first side of the trench and spans the first and second layers of electrically conducting material on an opposing side of the trench; an electrolyte at least partially filling the trench; a gate electrode in contact with the electrolyte; a voltage source connected to the first layer of electrically conducting material on the first side of the trench; and a ground connected to the first layer of electrically conducting material on the second side of the trench.

One embodiment of a differential pair includes a vertically stacked structure comprising: a first layer of electrically conducting material; a second layer of electrically conducting material; and a layer of electrically insulating material separating the first layer of electrically conducting material from the second layer of electrically conducting material. A trench extends vertically through the vertically stacked structure, bisecting the first layer of electrically conducting material, but not the second layer of electrically conducting material. The inverter further includes: a film of active material in the trench, wherein the film of active material spans the first and second layers of electrically conducting material on a first side of the trench and spans the first and second layers of electrically conducting material on an opposing side of the trench; an electrolyte at least partially filling the trench; a gate electrode in contact with the electrolyte; a voltage source connected across the bisected first layer of electrically conducting material; and a ground connected to the second layer of electrically conducting material.

One embodiment of a method for forming a vertical organic electrochemical transistor includes the steps of forming a vertically stacked structure on a support substrate, the vertically stacked structure comprising, from bottom to top: a first layer of electrically conducting material; a first layer of electrically insulating material over the first layer of electrically conducting material; a second layer of electrically conducting material over the first layer of electrically insulating material; a second layer of electrically insulating material over the second layer of electrically conducting material; and a hydrophobic capping layer over the second layer of electrically insulating material. The method further includes the steps of: forming a trench in a central portion of the vertically stacked structure, the trench extending from the capping layer down through the first layer of electrically conducting material; depositing a liquid comprising an organic active material in the trench; evaporating the liquid to form a film of the organic active material in the trench, wherein the film of organic active material laterally spans the width of the trench and vertically spans the first and second layers of electrically conducting material; filling the trench with an electrolyte; and placing a gate electrode in electrical communication with the organic active material.

BRIEF DESCRIPTION OF THE DRAWINGS

Illustrative embodiments of the invention will hereafter be described with reference to the accompanying drawings, wherein like numerals denote like elements.

FIG. 2, top left panel, is a schematic diagram showing a cross-sectional view of a vOECT pair of a complementary inverter in which the sources of the two OECT are shorted. FIG. 2, bottom left panel, shows a top view of the vOECT pair. In the top view, electrically insulating layer 108 is not shown so that both of the electrically conducting layers can be seen. FIG. 2, right panel, shows the circuit diagram for the vOECT pair of the complementary inverter.

FIG. 3, bottom left panel, shows a top view the vOECT differential pair. FIG. 3, right panel, shows the circuit diagram for the vOECT differential pair.

FIGS. 6A-6E show Vertical and Planar OECTs in a cofacial pair configuration. FIG. 6A shows a cross sectional schematic of the cofacial pair showing materials, dimensions, and contacts for individual OECT wiring, as well as for the on-chip inverter. Shown above is the chemical structure of p($C_4$-T2-$C_0$-EG). (See, (Mayon, David of al. "influence of Side Chains on the n-Type Organic Electrochemical Transistor Performance." *ACS Applied Materials & Interfaces* 13.3 (2021): 4253-4266.) FIG. 6B shows a tilted SEM micrograph of the cross section of the cofacial pair of OECTs. Focused ion beam (FIB) milling was used to expose the cross section, necessitating a thick layer of Pt deposited on top of the completed device. Scale bar=1 µm. FIG. 6C shows transfer curves of all the possible p-type ($\Delta V_g$=0.01 V, 0V to -0.8V and $V_d$=-0.4 V) and n-type ($\Delta V_g$=0.01 V, 0 V to 0.6 V and $V_d$=0.4 V) OECTs (2 pOECTs, 2 vOECTs, and the 2 vOECTs in series) of the cofacial pair. FIG. 6D shows output curves of the p-type ($\Delta V_g$=0.05 V, 0 V to -0.8 V and $V_d$: 0 to -0.4 V) and n-type ($\Delta V_g$=0.05 V, 0 V to 0.6 V and $V_d$: 0 to 0.4V) bottom and top pOECTs of the cofacial pair. FIG. 6E shows output curves of the p-type ($\Delta V_g$=0.05 V, 0 V to -0.8 V and $V_d$: 0 to -0.4 V) and n-type ($\Delta V_g$=0.05 V, 0 V to 0.6 V and $V_d$: 0 to 0.4 V) left and right vOECTs of the cofacial pair.

FIG. 7A shows the wiring diagram for an OECT-based complementary inverter with two OECTs independently gated. FIG. 7B shows the condensed wiring diagram of an OECT complementary inverter based on a cofacial pair of vOECTs. FIG. 7C shows a schematic cross section of a cofacial pair wired as a complementary inverter and a top view microscopic image of the cofacial inverter. FIG. 7D shows the voltage transfer characteristics of the cofacial pair inverter ($\Delta V_{in}$=0.01 V, 0 to 0.6 V and $V_{DD}$=0.7, 0.75, and 0.8 V). The corresponding gain ($\delta V_{out}/\delta V_{in}$) with peak gains of 15, 18, and 28 for $V_{DD}$=0.7, 0.75, and 0.8 V, respectively.

FIGS. 8A-8C show electrocardiogram (ECG) signal amplification using cofacial pair complementary inverter. FIG. 8A shows the wiring diagram of the cofacial pair inverter when used as a voltage preamplifier. 3M adhesive medical electrodes are placed below the clavicle on both the right and left side with one being connected to a DC offset and the other connected directly to the input of the inverter on a benchtop. FIG. 8B shows the ECG signal recorded from the output of the cofacial pair inverter. FIG. 8C shows the ECG signal recorded directly between the adhesive medical electrodes using a benchtop digital multimeter.

FIGS. 9A-9C show a laser-cut and self-aligned cofacial complementary inverter pair. FIG. 9A shows an optical micrograph of the self-aligned laser cut cofacial pair. The thinner dotted outline denotes the shorted bottom contacts of the vOECTs where $V_{out}$ of the inverter is recorded. The thicker dashed box outlines the top contacts of the vOECTs of the inverter that are connected to $V_{DD}$ and ground. Scale bar=5 µm. FIG. 9B shows a tilted SEM micrograph of the cross section of the cofacial pair of OECTs. FIB milling was used to expose the cross section, requiring deposition of a thick Pt layer. Scale bar=200 µm. FIG. 9C shows the voltage transfer characteristics of the cofacial pair inverter ($\Delta V_{in}$=0.01 V, 0 V to 0.6 V and $V_{DD}$=0.8 V) and the corresponding gain ($\delta V_{out}/\delta V_{in}$) with a peak gain of about 12.

DETAILED DESCRIPTION

Methods for fabricating vOECTs are provided. Also provided are vOECTs made using the methods and vOECT pairs for use in circuits, such as complementary inverters and differential pairs. The vOECT pairs share a common active material that is deposited in a trench separating the vOECTs of the pair.

Figure 1A:
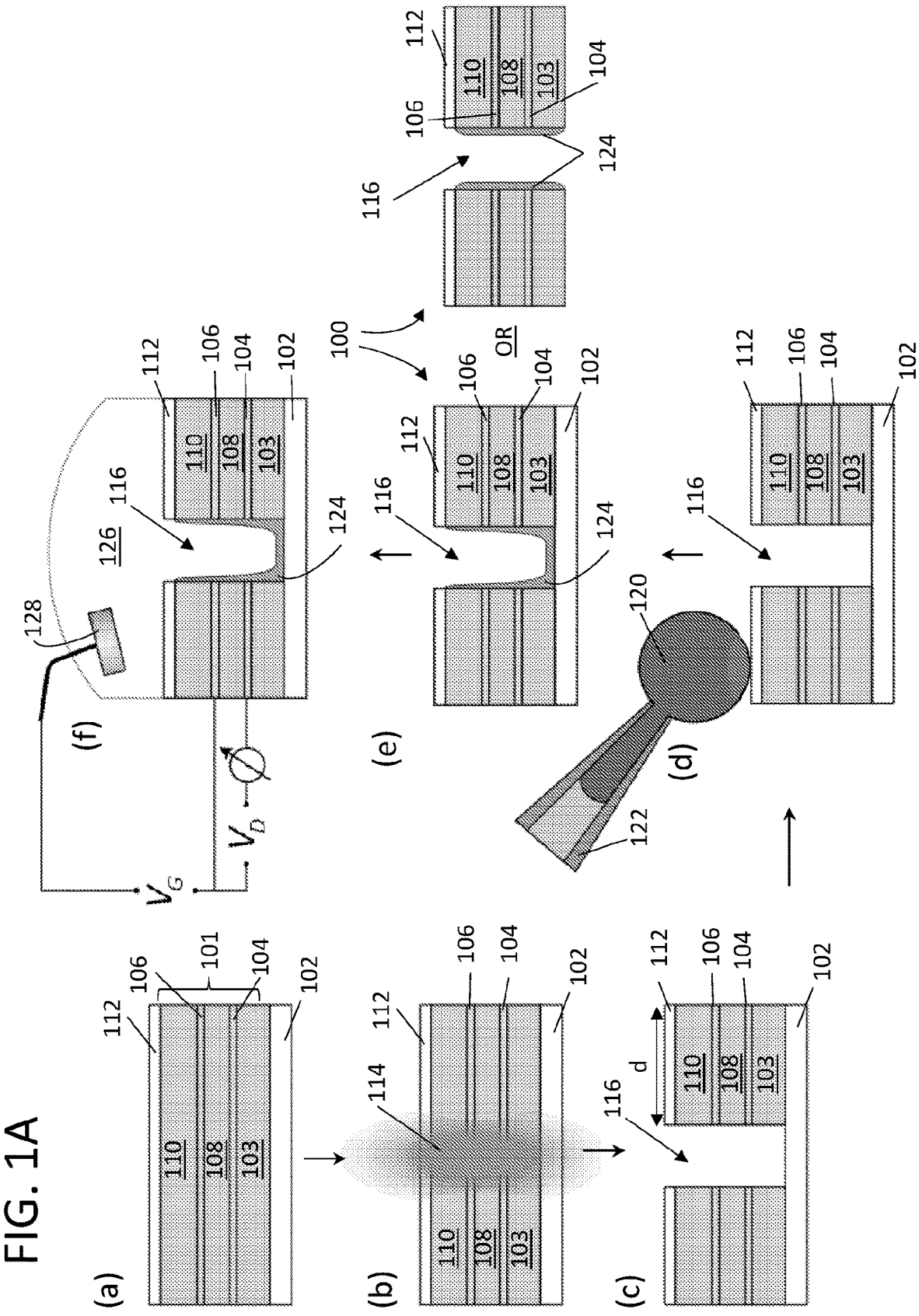
FIG. 1A, panels (a)-(f), shows a method of making the source contact, drain contact, and channel layer of a pair of vOECTs.

The vOECT pairs can be fabricated using, for example, photolithography. Alternatively, they can be fabricated using a self-aligning insulation layer and a laser cut trench, as described in more detail below. Both fabrication techniques are illustrated in Example 3. One embodiment of a method for making a vOECT that uses a self-aligning insulation layer and a laser cut channel is illustrated schematically in FIG. 1A, panels (a) through (f). As shown in FIG. 1A, panel (a), the method begins with a stacked structure 101 on a support substrate 102. Stacked structure 101 includes a first layer of an electrically conducting material 104, a first layer of an electrically insulating material 108, a second layer of an electrically conducting material 106, a second layer of an electrically insulating material 110, and a hydrophobic capping layer 112. Optionally, a third layer of an electrically insulating material 103 can be introduced between substrate 102 and first electrically conducting layer 104.

Examples of electrically conducting materials include metals, such as gold and copper, and electrically conducting oxides. Electrically insulating materials include organic dielectrics, such as parylene C, polyimide poly(vinylidene fluoride) (PVDF), and polyimide (Kapton), and inorganic dielectrics, such as metal oxides. Examples of hydrophobic materials that can be used to form the capping layer include polytetrafluoroethylene or self-assembled monolayers of organic surface modifiers. By way of illustration, the hydrophobic materials include materials on which a water droplet forms a contact angle of greater than 90°, as measured by the static sessile drop method. This includes materials on which a water droplet forms a contact angle of greater than 120°, as measured by the static sessile drop method.

The layers that make up the stacked structure can be applied using a variety of techniques, such as thermal evaporation, spin coating, vapor deposition, and, in the case of oxides, atomic layer deposition (ALD), and can be formed with a range of thicknesses. However, because the thickness of electrically insulating layer 108 defines the channel length of the vOECTs and shorter channel lengths provide better amplification capabilities, the electrically insulating layer is desirably no thicker than 2 μm. This includes embodiments in which insulating layer 108 has a thickness of 1 μm or smaller and further includes embodiments in which the insulating layer has a thickness of 500 nm or smaller. However, thicker layers can be used.

A trench 116 is formed in a central portion of stacked structure 101, as illustrated in panels (b) and (c) of FIG. 1A. As used herein, the term "central portion" is used to indicate that the trench is formed some distance 'd' away from the edge of stacked structure 101, as opposed to running along an edge of stacked structure 101, such that a part of the stacked structure remains on either side of the trench after it is formed. However, the trench need not be formed through the geometric center of the stacked structure in order to be considered "formed through a central portion" of the stacked structure. The trench can be formed using a variety of techniques including, for example, laser 114 cutting, photolithography, water jet machining, and focused ion beam machining. Trench 116 extends downward through capping layer 112, second electrically insulating layer 110, second electrically conducting layer 106, first electrically insulating layer 108, and first electrically conducting layer 104. The width of the trench can be very narrow. By way of illustration, trenches having widths of less than 1000 μm, less than 500 μm, less than 100 μm, or less than 10 μm can be formed.

In the embodiment shown in FIG. 1A, panel (c), the trench is cut through the entire thickness of electrically insulating layer 103, so that the surface of support substrate 102 is exposed through trench 116. In this embodiment, the trench is defined between two opposing side walls provided by the stacked structure and a floor connecting the side walls that is provided by the surface of support substrate 102. However, trench 116 need not be cut all the way through electrically insulating layer 103. In some embodiments, electrically insulating layer 103 is a mechanically flexible layer, such as a polymeric layer. In embodiments in which electrically insulating layer 103 is mechanically flexible, trench 116 may terminate at the upper surface of layer 103, or may extend only partially through the thickness of layer 103. In such embodiments, support substrate 102 can be removed, leaving electrically insulating layer 103 as a flexible substrate for the vOECTs.

A liquid 120 comprising an active material is then deposited into trench 116, at least partially filling said trench with said liquid. Liquid 120 may comprise active material dispersed or dissolved in an aqueous or a hydrophilic non-aqueous solvent. Liquid 120 is desirably hydrophilic so that it can move easily across capping layer 112 without wetting for delivery into trench 116. As shown in FIG. 1A, panel (d), the upper surface of liquid 120 will generally form a meniscus. Liquid 120 may be delivered to trench 116 using, for example, inkjet printing, dip coating, or by dragging drops of liquid 120 applied by a nozzle, such as a pipette tip, or other fluidic delivery device 122 across hydrophobic capping layer 112 and dropping the drops of liquid into trench 116. It is the use of the hydrophobic capping layer 112 that allows the liquid comprising organic active material to be "dragged and dropped" in this manner.

The volume of liquid delivered to the trench should be sufficient to provide a dried film comprising the active material that spans the width of trench 116 in the lateral direction and also spans first electrically conducting layer 104 and second electrically conducting layer 106 in the vertical direction, as shown in FIG. 1A, panel (e). However, the active material desirably does not extend above the upper opening of the trench and, in some embodiments, does not extend beyond second electrically conducting layer 106. This minimizes stray capacitance. Thus, in some embodiments of the vOECTs, excess active material extending beyond the upper contact is minimized or eliminated.

As used herein, the term "active material" refers to an electrically conducting or semiconductive material that is capable of acting as a doped or intrinsic semiconducting channel of a vOECT. The active material may be an organic material or an inorganic material, including a nano-material, such as carbon nanotubes. Organic active materials include organic semiconductors, such as those recognized as suitable for use as channel materials for conventional transistors. Poly(3,4-ethylenedioxythiophene) doped with poly (styrenesulfonate) (PEDOT:PSS) is one example of an organic active material that can be used. In some embodiments, the doped organic semiconductor is present in a fully polymerized form dissolved and/or dispersed in water and/or organic solvent. However, liquid 120 may also include active material precursors, such as monomers, oligomers, and/or crosslinking agents, that undergo polymerization reactions to form the organic active materials during drying and curing of the liquid.

The active material-containing liquid 120 in trench 116 is then dried and cured to form a dried film 124 of active material (FIG. 1A, panel (e)). During drying, volatile components in the liquid, such as water and/or organic solvents, evaporate. This process may be aided using heating and/or vacuum. If the active materials are curable, curing also takes place to provide a cured active material film. During curing, the active material and/or active material precursors polymerize and/or crosslink into solid film 124. In the illustrative embodiment of FIG. 1A, panels (a)-(f), after drying and, optionally, curing, active layer film 124 runs across the floor of trench 116 and upward along the walls of trench 116 (FIG. 1A, panel (e), left side). If desired, the portion of active layer along the floor of trench 116 can be removed. Support substrate 102 may also be removed (FIG. 1A, panel (e), right side). The depth to which liquid 120 fills trench 116 should be sufficient to provide a cured film of active material that vertically spans first 104 and second 106 electrically conducting layers on both sides of the trench.

Figure 1B:
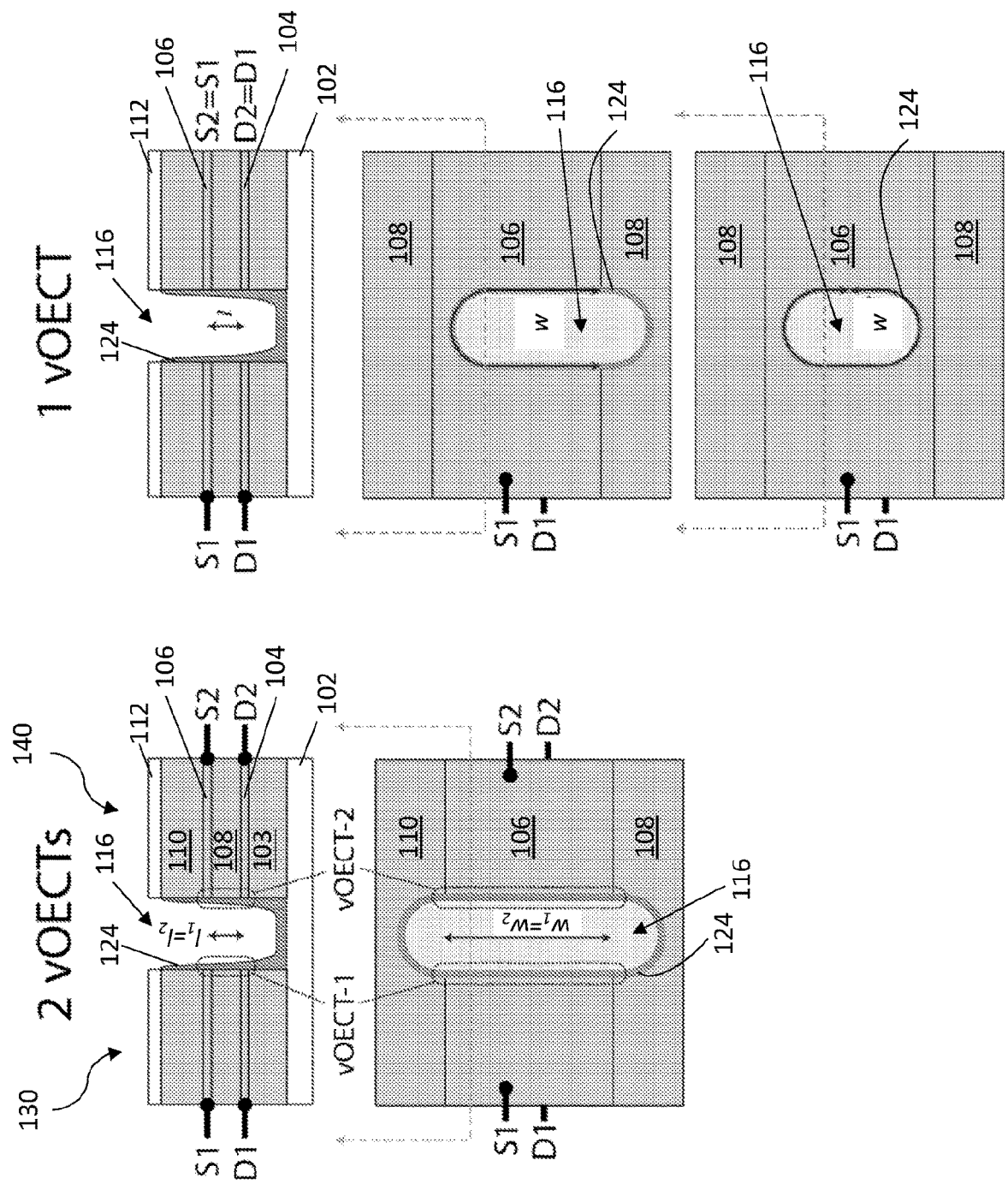
FIG. 1B illustrates the fabrication of a pair of vOECTS using the methods described herein (left side) and the fabrication of a single vOECT using the methods described herein.

If trench 116 completely bisects electrically conducting layers 104 and 106, the process illustrated in FIG. 1A, panels (a)-(f), will form two vOECTs that share a common active channel material 124, as illustrated on the left side of FIG. 1B. FIG. 1B, left side, shows a cross-sectional side view (upper panel) and a top view of second electrically conducting layer 106 (lower panel) of the structure. In this device, bisected first electrically conducting layer 104 provides a drain contact (D1 and D2) for both the first vOECT 130 and the second vOECT 140, bisected second electrically conducting layer 106 provides a source contact (S1 and S2) for both the first vOECT 130 and the second vOECT 140 (or vice versa), and active material film 124 provides the conductive or semiconductive channel for both vOECTs in the pair. The channel lengths ($I_1$ and $I_2$) of the two vOECTs correspond to the thickness of the electrically insulating layer 108 that separates electrically conducting layers 104 and 106, and the channel widths ($w_1$ and $w_2$) of the two vOECTs correspond to the widths of the electrically conducting layers 104 and 106.

As with other transistors, the vOECTs described herein are three terminal devices (i.e., having drain, source, and gate contacts) with a channel between the source and drain contacts. When a bias is applied to the gate contact, it induces ionic drift into the channel, effectively de-doping/doping the channel, while current is collected at the drain. For sensing applications, the modulation of the drain current can be monitored. Small changes in the gate bias result in large changes in the drain current, leading to high transconductance ($g_m$), which translates into high local voltage to current amplification.

Figure 3:
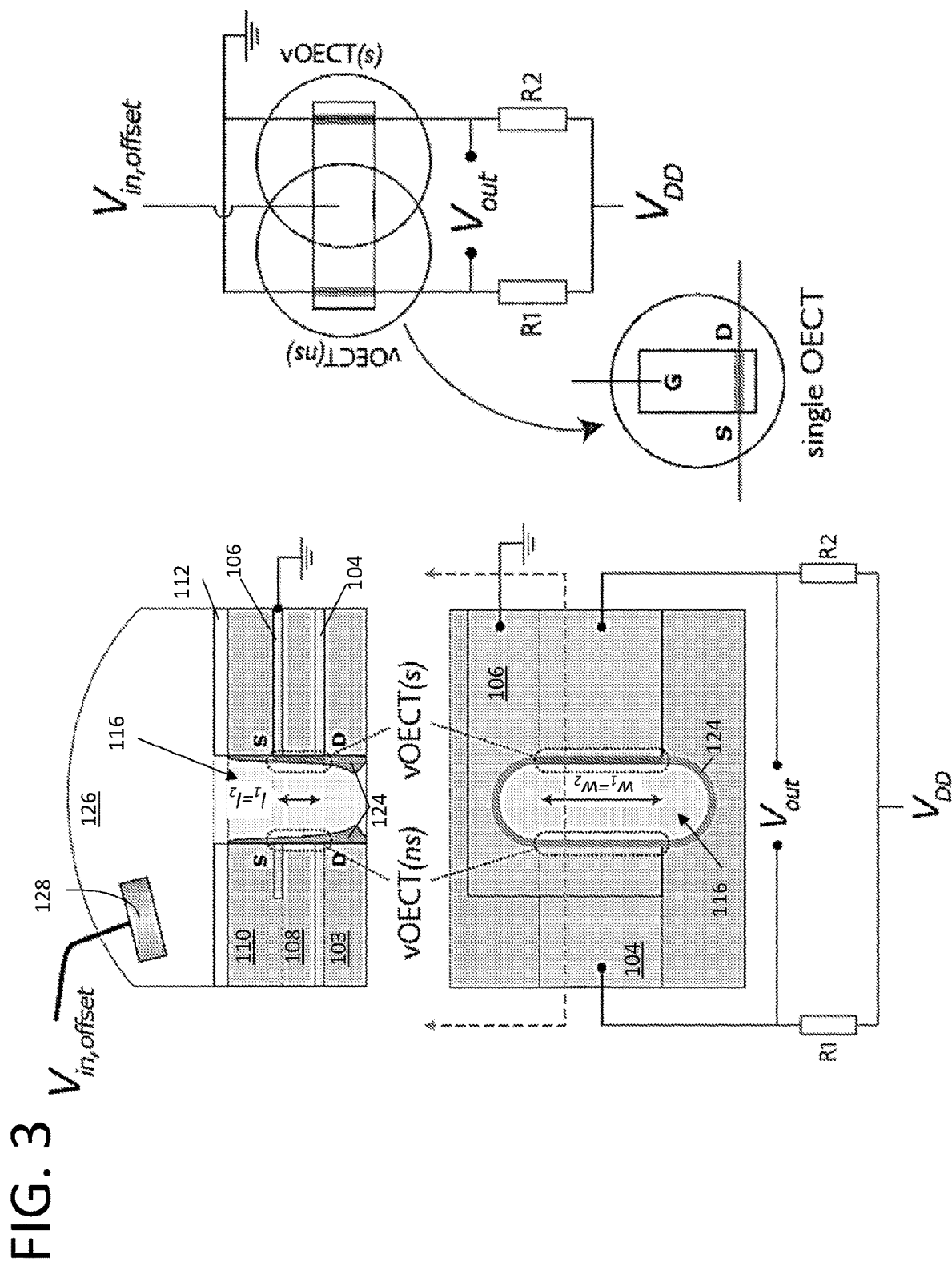
FIG. 3, top left panel, is a schematic diagram showing a cross-sectional view of a vOECT pair of a differential pair.

For vOECT pairs to be used in a circuit, one or both of electrically conducting layers 104 and 106 may remain connected (intact) around a peripheral portion of trench 116, such that the drains or the sources and drains of both transistors in the pair are shorted, as described in more detail below with respect to FIGS. 2 and 3.

For use in complementary circuits, the active material should be an ambipolar active material having both hole and electron transporting capabilities, as patterning cofacial transistors with different active materials would be challenging at the size scales of trench 116 width. The ambipolar semiconductors operate as both an n-type channel and a p-type channel for the vOECTs of the pair.

Ambipolar semiconducting conjugated polymers, such as the naphthalene diimide-thiophene based materials, described in Giovannitti, Alexander, et al. "N-type organic electrochemical transistors with stability in water." *Nature communications* 7 (2016): 13066; and Ohayon, David, et al. "Influence of Side Chains on the n-Type Organic Electrochemical Transistor Performance," *ACS Applied Materials & Interlaces* 13.3 (2021): 4253-4266, are examples of suitable ambipolar semiconductor materials that can be used as the active material. A specific example of an ambipolar polymer is a polymer having naphthalenetetracarboxylic diimide units with hybrid alkyl-glycol side chains and triethylene glycol-substituted bithiophene units.

As an alternative to ambipolar semiconductor materials, a blend of p-type and n-type semiconductor materials can be used, wherein the ratio of the two materials in the blend is chosen to balance transport/current for p-type and n-type operation. In yet another alternative embodiment, channel materials, such as polyaniline (PANT), which show "finite conductivity" windows, with positive and negative transconductance regions, can be used. The transconductance regions can be chemically shifted with respect to one another by electrochemically doping or otherwise modifying the characteristics of the channel material being used.

Alternatively, if trench 116 is cut into, but does not completely bisect, electrically conducting layers 104 and 106, the process illustrated in FIG. 1A, panels (a)-(f), will form one vOECT, as illustrated on the right side of FIG. 1B.

FIG. 1B, right side, top panel, shows a cross-sectional side view (upper panel) of a structure in which trench 116 does not bisect the electrically conducting layers. The middle and lower panels on the right side of FIG. 1B show two embodiments of a vOECT, as viewed from the top of second electrically conducting layer 106 of the structure. In one embodiment (middle panel), trench 116 extends through one edge of electrically conducting layers 104 and 106, but does not extend all the way through the electrically conducting layers. In another embodiment (lower panel), trench 116 is surrounded by electrically conducting layers 104 and 106. In both embodiments, first electrically conducting layer 104 provides a drain contact (D1) for the vOECT, second electrically conducting layer 106 provides a source contact (S1) for the vOECT (or vice versa), and active material film 124 provides the conductive or semiconductive channel for the vOECT. The channel length of the vOECT corresponds to the thickness of the electrically insulating layer 108 that separates electrically conducting layers 104 and 106, and the channel width (w) corresponds to the portion of the perimeter of trench 116 that contacts electrically conducting layers 104 and 106.

One embodiment of an electrolyte-gated vOECT made using the methods described above is shown in FIG. 4. The source and drain contacts are provided by first and second electrically conducting layers 304 and 306. A second electrically insulating layer 310 is capped by hydrophobic capping layer 312. A film of organic active material 324 provides the channel layer, which is immersed in an electrolyte 326 that fills trench 316. A gate electrode 328 in electrical communication with channel layer 324 can be biased with a gate bias to modulate the current through channel layer 324. The vOECT includes a substrate 302 and a third electrically insulating layer 303.

Figure 4:
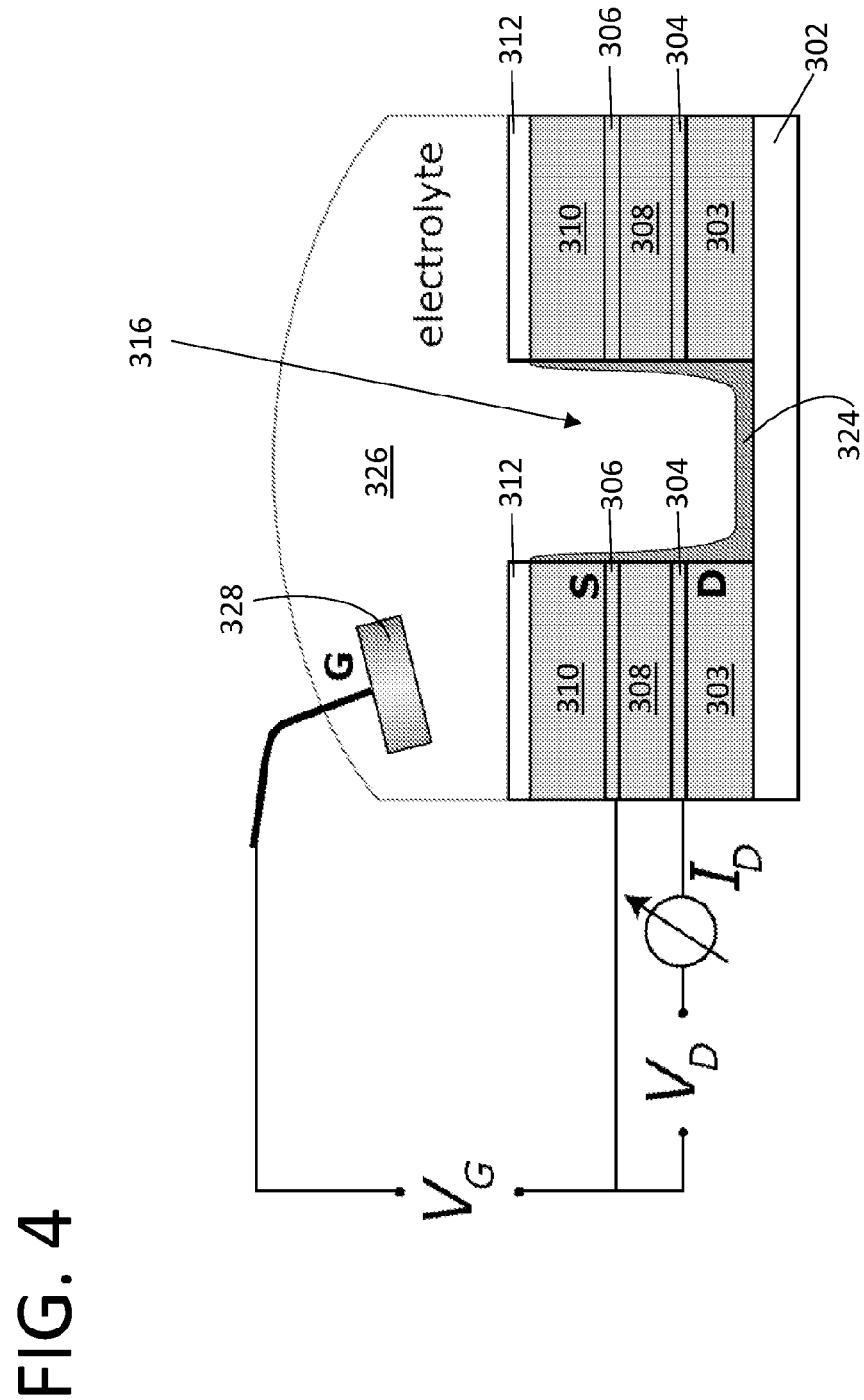
FIG. 4 shows the structure and electrical connection of a vOECT.

Although the second layer of electrically conducting material 306 provides the drain contact, and the first layer of electrically conducting material 304 provides the source contact in the embodiment of the vOECT shown in FIG. 4, it is also possible to form the drain contact from electrically conducting layer 304 and the source contact from electrically conducting layer 306 in the devices described herein.

FIG. 2 shows a cross-sectional side view of a complementary inverter that incorporates a vOECT pair. In this device, whichever electrically conducting layer provides the source contacts of the two transistors (layer 106 in the embodiment of FIG. 2) is completely bisected by trench 116, but whichever electrically conducting layer provides the drain contacts of the two transistors (layer 104 in the embodiment of FIG. 2) is not completely bisected. Generally, if active material 124 is not removed at the bottom of trench 116, the lower electrically conducting layer (layer 104) will provide the drain contacts since that layer is also shorted through the active material 124. However, if active material 124 is removed at the bottom of trench 116, either of the electrically conducting layers (104) or (106) could be used to provide the drain contacts.

Bisected electrically conducting layer 106 forms two electrically isolated portions on opposite sides of trench 116, one of which can be connected to a voltage source and the other of which can be connected to ground. Electrically conducting layer 104 forms two connected (i.e., shorted) portions that remain connected together around part of the perimeter of trench 116 by a strip 109 of the electrically conducting material. This provides a voltage output terminal for the inverter.

In the complementary inverter, one of the vOECTs is a p-type operating vOECT (vOECT(p)), the other vOECT is an n-type operating vOECT (vOECT(n)), and active material film 124 provides the doped or intrinsic semiconducting channel for both vOECTs in the inverter. The channel lengths ($l_1$ and $l_2$) of the two vOECTs correspond to the thickness of the electrically insulating layer 108 that separates electrically conducting layers 104 and 106, and the channel widths ($w_1$ and $w_2$) of the two vOECTs correspond to the width of the electrically conducting layer 106 in the embodiment shown in FIG. 2, or to the width defined by the shorter of the two electrically conducting layers, such that a channel area is defined by the region for which both the source and the drain bracket the active channel. Active material 124 is immersed in an electrolyte 126 that fills trench 116. A gate electrode 128 in electrical communication with channel layer 124 can be biased with a gate bias to modulate the current through channel layer 124. In the form, a complementary pair used for potentiometric sensing, the gate, 128, may be considered a reference (which may have an offset), and the measured input would be a desired biological signal which modulates the effective voltage input at the channel.

The circuit diagram for the complementary inverter is shown in the right panel of FIG. 2, including the voltage input or offset ($V_{in,offset}$), the voltage output ($V_{out}$), the supply voltage ($V_{DD}$), and the ground.

The complementary inverter can be used in a variety of on-site and in-sensor amplification applications, such as an analog voltage preamplifier for recording electrocardiogram signals, as illustrated in Example 3. The co-localization of a simple circuit using vOECTs is also applicable to other on-site signal processing functions, including rectification and reference-based differential biochemical detection on flexible and conformal bioelectronic arrays.

A differential pair is another example of an embodiment of a co-facial transistor (vOECT) pair that can form a differential amplifier. A circuit diagram for a differential vOECT pair is shown in FIG. 3, right panel, including the voltage input or offset ($V_{in,offset}$), the voltage output ($V_{out}$), the supply voltage ($V_{DD}$), and the ground. The stacked structure of the differential pair is similar to that of the complementary inverter. However, in the differential amplifier, it is the electrically conducting layer that provides that source contacts (layer 106 in the embodiment of FIG. 3) remain connected around the periphery of trench 116.

For use in biomolecule sensing applications, one or both channels of the vOECTs of the differential pair can be functionalized for biological sensing, and the difference between the drain currents of the two transistor channels can be measured and amplified. As shown in FIG. 3, the two source contacts are grounded, while the two drain contacts are wired as shown in the figure. The two resistors shown in FIG. 3 are used to balance the operation of the differential amplifier/Wheatstone bridge. Alternatively, these resistors can be replaced with active complementary transistors (FETs, for example) forming a complimentary differential amplifier. In this embodiment, which comprises the co-facial vOECT differential pair, a sensing measurement with internal reference/control is provided.

EXAMPLES

Example 1: Fabrication of a vOECT Using a Self-Aligning Insulation Layer and a Laser Cut Trench Fabrication Steps:

Metal Patterning. To form the electrically conducting layers of the stacked structure, photoresist S1813 was spin coated onto a clean glass microscope slide at 3500 rpm and then baked at 110° C. for 1 min. The photoresist was exposed using ultraviolet (UV) light and developed in AZ400K 1:4 for 30 secs. An e-beam deposition system was then used to deposit 5 nm of chromium and 100 nm of gold. The slides were left in microposit 1165 overnight to facilitate liftoff.

Insulation Deposition. To form the electrically insulating layers of the stacked structure, the slides were placed in a Parylene C (PaC) coater. A film of PaC with a thickness of approximately 2 µm was deposited over each slide using an adhesion promoter. Contact pads were protected before placing the slides into the coater in order to avoid coating with insulating material, to ensure connection with a data acquisition system.

The Metal Pattering and Insulation Deposition steps were then repeated to form the second electrically conducting layer and the second electrically insulating layer.

Teflon Coating. The hydrophobic capping layer was formed by spin coating with Teflon at 1500 rpm for 45 seconds and baking at 215° C. for 20 mins.

Laser Cutting Trench. A trench was then formed through the stacked structure by laser cutting using a LPKF Proto-Laser R: power: 2 W; repetition: 1; frequency: 40 kHz.

Organic Active Material Deposition. The organic active material (PEDOT:PSS in this case) was deposited into the trench by placing liquid drops comprising dissolved active material onto the hydrophobic capping layer and dragging them into the trench. The PEDOT:PSS dispersion, which included an epoxy silane crosslinker was dried and cured on hot plate at 90° C.

Figure 5:
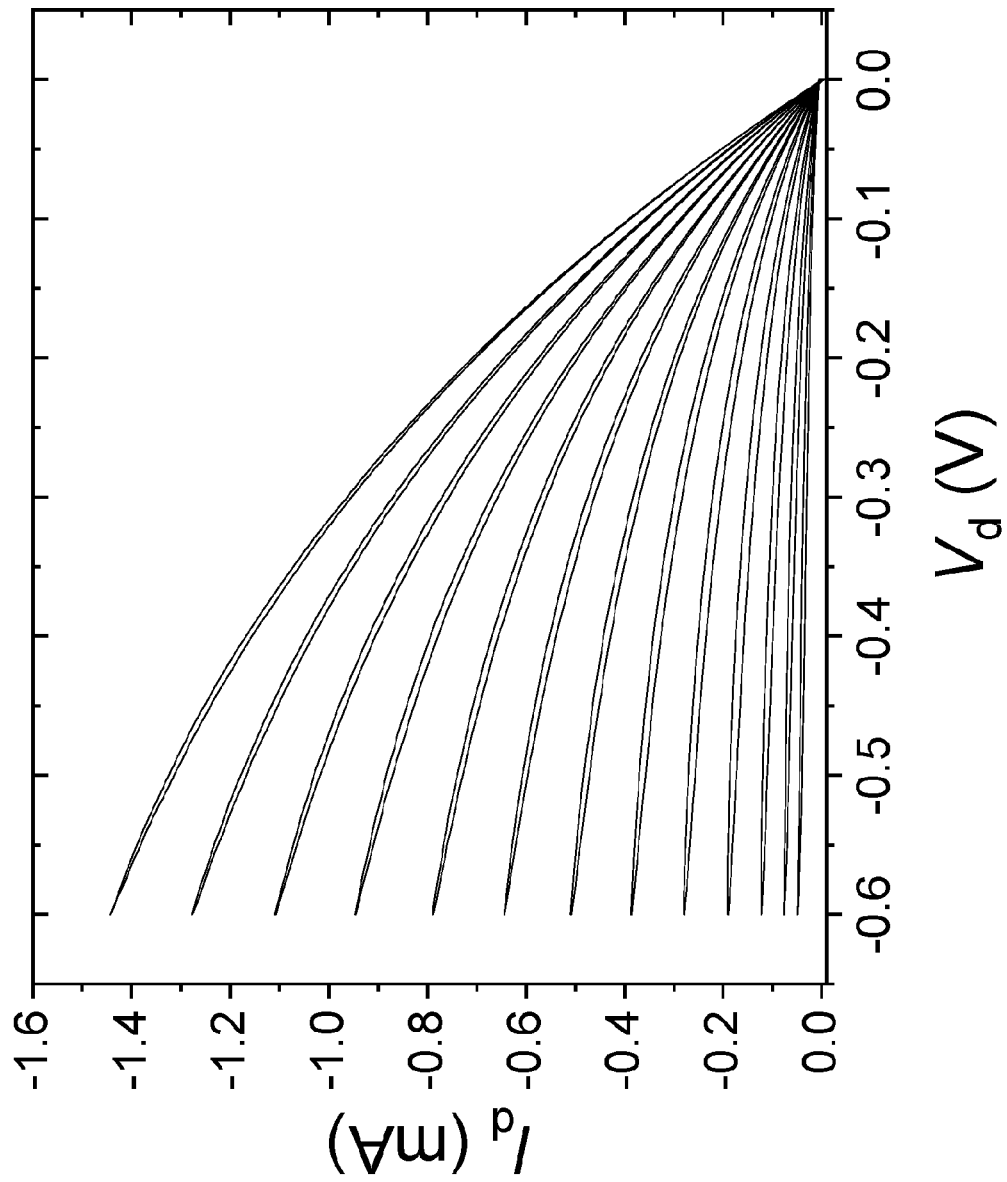
FIG. 5 shows the output curve ($I_D$ vs $V_D$) of the vOECTs of Example 1.

The output curve for the vOECT is shown in FIG. 5. This data was collected using a National Instruments PXIe-1082 and two source measuring units (PXIe-4143) using custom Lab View code. Output curves were measured by applying a $V_D$ of 0 to $-0.6V$ and a $V_G$ of 0 to 0.6V. This measurement was done in 0.1M NaCl using an external Ag/AgCl electrode as the gate.

Example 2: Fabrication of a vOECT-Based Complementary Inverter Using PEDOT:PSS a Self-Aligning Insulation Layer and a Laser Cut Trench The vOECT-based complementary inverted was fabricated using the same metal patterning, insulation deposition, Teflon coating, and trench cutting steps described in Example 1, followed by organic active material deposition. The organic active material (ambipolar semiconducting polymer material) was deposited into the trench by placing liquid drops comprising dissolved active material onto the hydrophobic capping layer and dragging them into the trench.

Example 3: Fabrication and Characterization of an Amplifying Complementary Inverter Based on a Cofacial vOECT This example illustrates a compact form factor amplifying (voltage to voltage) sensing node based on a vOECT inverter. vOECTs were used in a cofacial pair configuration, which has two vOECTs facing one another sharing a single channel. This approach defines an inverter in the same footprint as a single planar OECT. The use of vOECTs allows for the preservation of high gain with reduced area; the cofacial OECT inverter demonstrated a peak gain of about 28. To validate the cofacial OECT inverter as a voltage amplifier, electrocardiograms (ECGs) were recorded from healthy subjects with a gain of 10.

Results

Cofacial OECT Pair Fabrication and Characterization

Figure 6A:
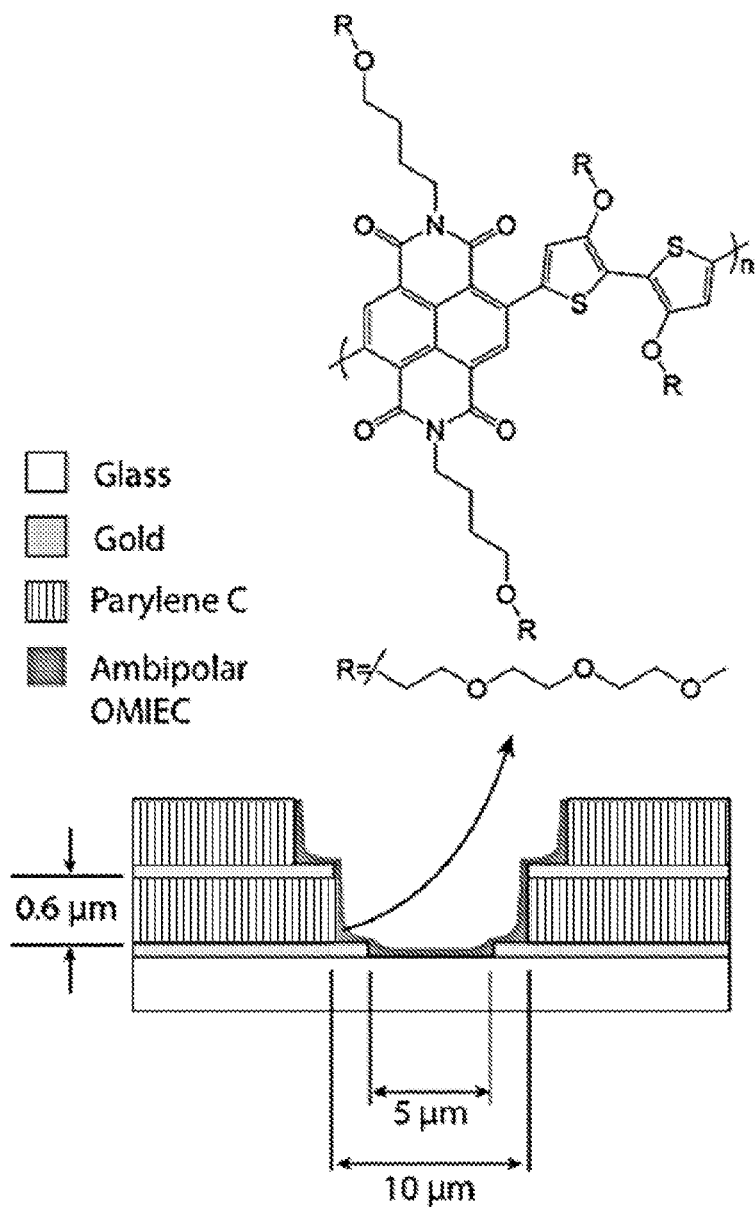
Figure 6B:
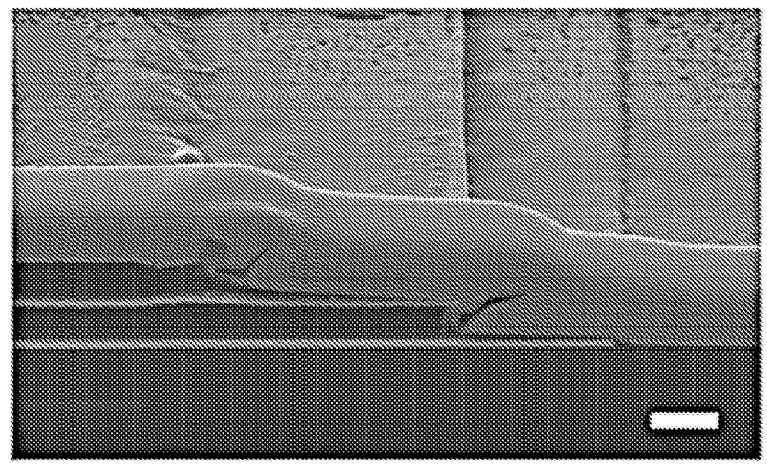
Figure 6E:
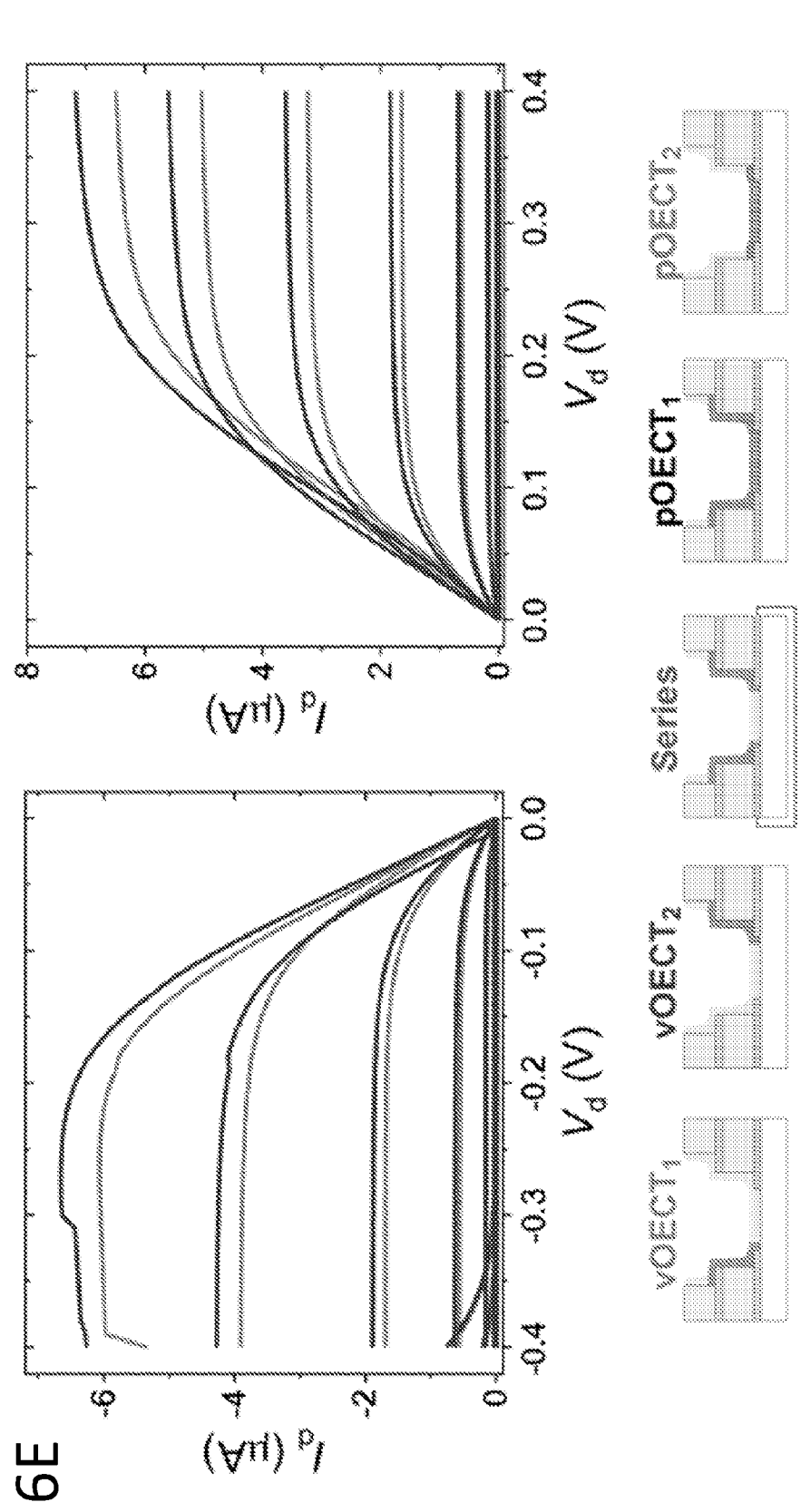

The vertical form factor of vOECTs had the advantage of achieving a small footprint for the active sensing node. By simultaneously patterning two vOECTs along opposite side walls of a trench with a single active area, a cofacial pair of vOECTs was formed that would later form the basis for a complementary inverter or other differential sensing concepts (FIGS. 6A, 6B). These structures were fabricated entirely photolithographically (i.e., without the use of a self-aligning insulation layer and a laser cut trench), whereby two metallic layers separated by an insulating layer of Parylene C (PaC) served as the source and drain contacts and interconnects. In this case, the thickness of the separating PaC layer roughly defined the vOECT channel length (~600 nm), whereas the width of the vOECTs and the spacing between the cofacial vOECT pair were defined photolithographically by the etched area, as noted in FIG. 6A. The on-chip inverter structure required the bottom contacts to be shorted such that the two vOECTs were in series—this shorted terminal served as the output signal for the inverter, as discussed below. Full fabrication details can be found in the Methods section.

To test the operation of the vOECTs, the top and bottom contacts were chosen as the source and drain, respectively, while the gate was an Ag/AgCl electrode immersed in a 0.1M NaCl electrolyte. The resulting transfer and output I-V characteristics can be seen in FIGS. 6C-6E. Choosing top right and top left contacts as the source and drain terminals is a measure of the two vOECTs in series. As such, separate photolithographically fabricated test structures with the bottom contact not shorted were employed to test both planar device configurations (FIGS. 6C-6D). The channel length of the pOECTs was defined as the total OMIEC channel distance between the two contacts. The top pOECT of the pair had a length of 6.2 μm while the bottom pOECT had a length of 5 μm (FIGS. 6A-6E). Both the vOECTs and the pOECTs had a channel width of 100 μm and a channel thickness of 150 nm (this thickness was measured at the bottom of the photolithographically defined region, as an accurate determination of film thickness on the side walls was limited). As seen by the output and transfer curves in FIGS. 6C-6E, the drain current of the vOECTs was ~10 times higher than that of the pOECTs, for both p- and n-type, which is on par with the geometric scaling of the OECT channels, assuming comparable device thickness (i.e., current scaling roughly matches channel length scaling). To confirm the series measurement of the vOECTs with the on-chip shorted output, two isolated vOECTs were separately shorted together in series to confirm the peak current was ~½ the maximum current in the 2 vOECTs, as expected. The transfer characteristics of the vOECTs of a cofacial pair with the bottom contacts not shorted was comparable to the vOECTs with the shorted bottom contacts.

Cofacial Ambipolar Complementary Inverter

Figure 7A:
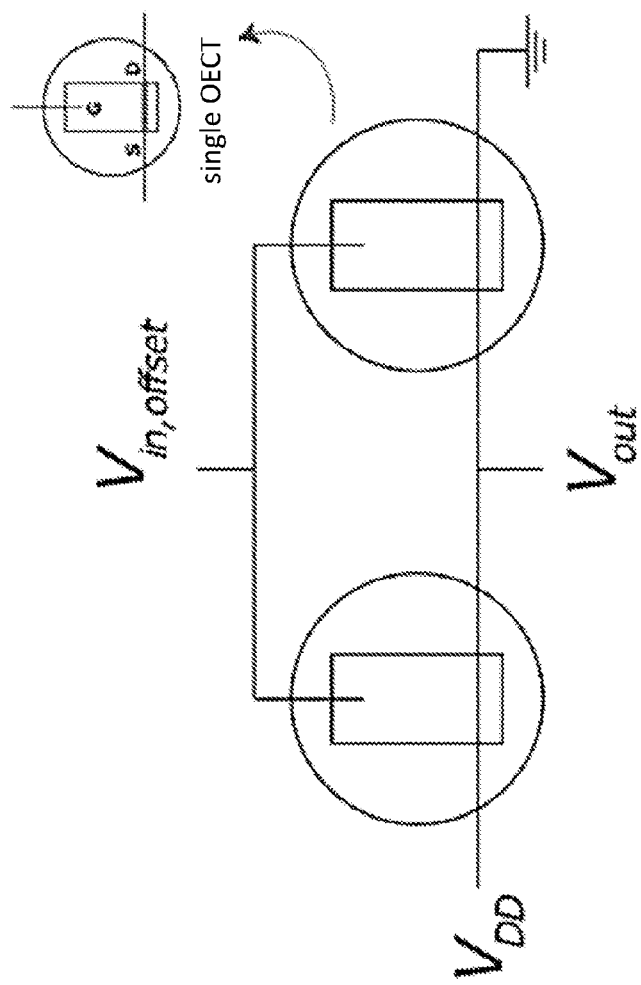
FIGS. 7A-7D show an OECT cofacial pair complementary inverter.

A traditional complementary inverter is typically made by separately wiring two different transistors, a p-type transistor and a n-type transistor (FIG. 7A). The source of the p-type OECT is connected to $V_{DD}$ while the source of the n-type OECT is wired to ground. The gates of the two OECTs are wired together externally to create a common input. Then the drain terminals of both OECTs are wired together externally to read $V_{out}$.

Figure 7B:
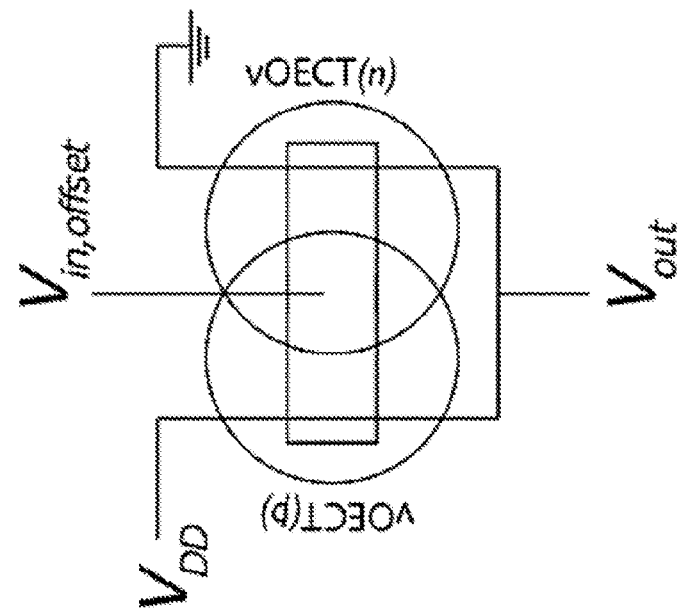

To achieve such an inverter within the footprint equivalent to that of a single planar OECT, the cofacial pair of vOECTs was employed as described above. An ambipolar material such as $p(C_4$-T2-$C_0$-EG) was used, as patterning opposing side walls to separately define a p-type and n-type material was not possible when implementing the inverter within a single trench. In the cofacial configuration, the shared electrolyte and Ag/AgCl gate contacted both channels, which coupled the input of the two OECTs. A proposed revised circuit diagram that better reflects the arrangement of the cofacial pair is shown in FIG. 7B.

Figure 7D:
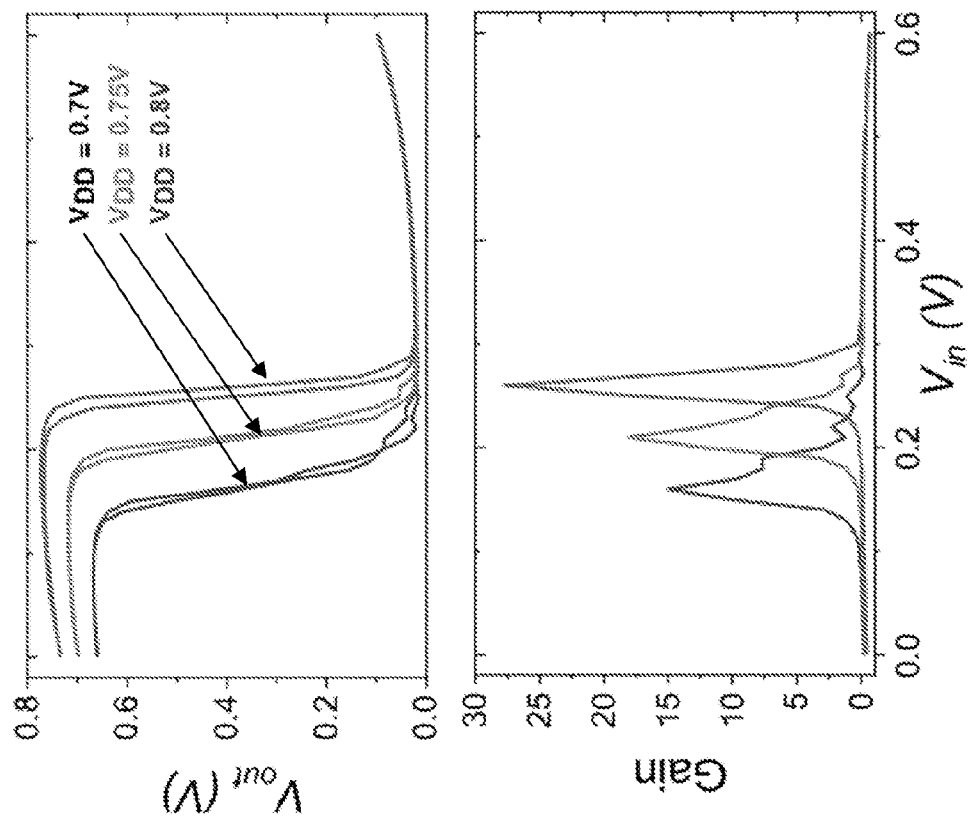
Figure 7C:
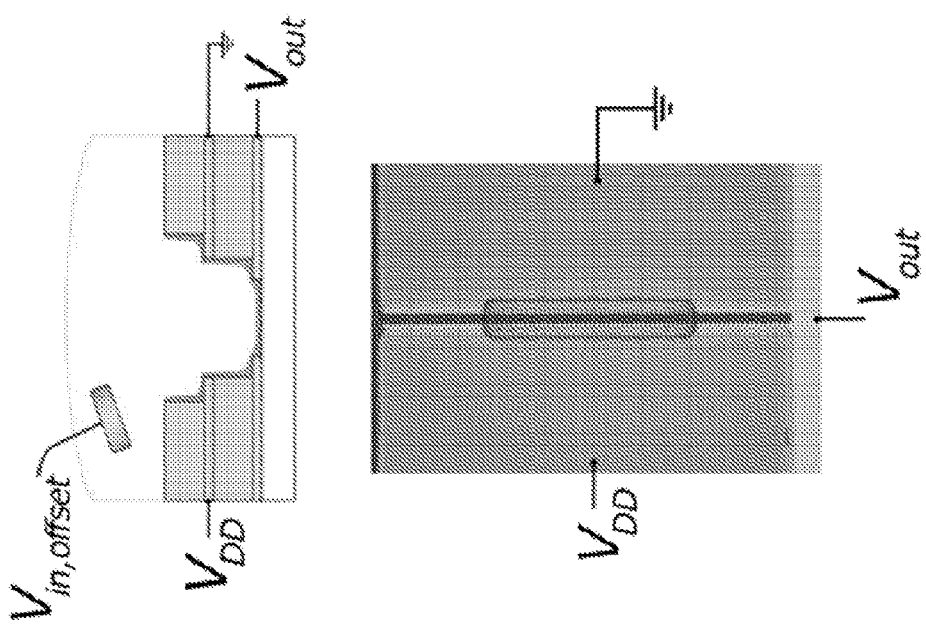

With an ambipolar material, one vOECT can behave as the p-type vOECT and the other the n-type vOECT depending on the effective $V_D$ at each channel. The source terminal of the p-type vOECT is connected to $V_{DD}$ and the source terminal of the n-type vOECT is connected to ground, which are the top contacts of the vOECTs. The shorted bottom contacts of each vOECT behave as the drain terminals where the output of the inverter ($V_{out}$) is recorded (FIG. 7C). The voltage transfer characteristics (VTCs) of the cofacial inverter pair were recorded with varying $V_{DD}$ (0.7, 0.75, 0.8) (FIG. 7D). The gain of the inverter was extracted from the voltage transfer characteristics ($\delta V_{out}/\delta V_{in}$) and increased as $V_{DD}$ increased, reaching a peak gain of about 28 at $V_{DD}$=0.8V (FIG. 7D).

Cofacial Inverter Pair as a Voltage Amplifier

To demonstrate the utility of the cofacial complementary inverter pair for amplifying biosignals, the concept was used as a benchtop preamplifier to record electrocardiograph (ECG) signals. One adhesive medical electrode was connected to the Ag/AgCl gate (input) of an inverter and the other was connected to a voltage supply set to an offset bias where peak gain occurs, 0.26 V, for this cofacial inverter (FIG. 8A). The output ECG had a peak-to-peak amplitude of around 5 mV (FIG. 8B). The potential difference between the two medical electrodes was measured for comparison, which resulted in a peak-to-peak amplitude around 0.5 mV (FIG. 8C). This measured gain of ~10 is consistent with the AC measurements noted above. Other differences in the ECG traces such as noise levels might be attributed to the low cutoff frequency of the inverter as compared to the direct voltage measurement using a digital multimeter (DMM).

Self-Aligned Laser-Cut Cofacial Inverter

As an alternative to photolithography, it is shown that the cofacial structure is versatile and amenable to a self-aligned laser-ablation based fabrication scheme. The cofacial inverter pair was assembled using a fabrication scheme utilizing a laser cut channel and self-aligning Teflon coating shown in FIG. 1A, panels (a-c). While photolithography was used to pattern the gold contacts, this fabrication method is compatible with printing techniques to eliminate photolithography completely. This fabrication method simplifies the fabrication of large area electronics and flexible devices for bioelectronics and ubiquitous computing. This self-aligning method overcomes the limit in channel alignment during photolithography to eliminate the channel overlap, which is beneficial for reducing parasitic capacitance and moving towards higher frequency recording in analog circuits and fast state switching in digital circuits.

Figure 9C:
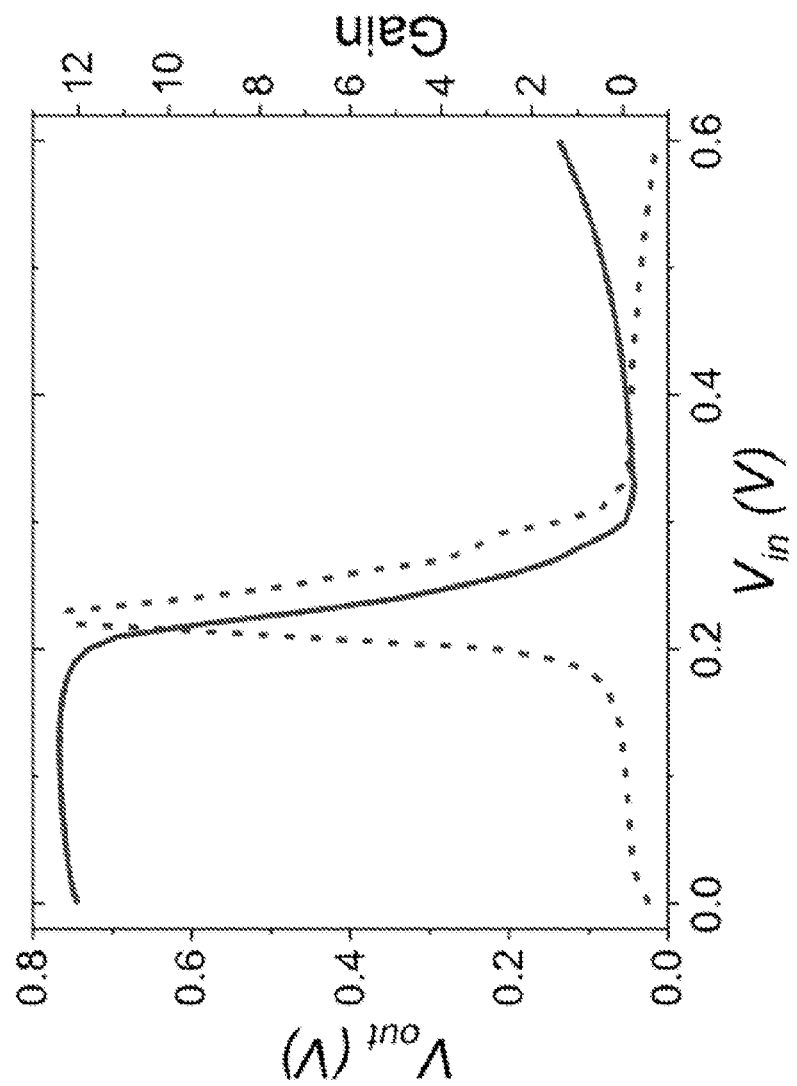

The multilayer stack (substrate, two metallic layers, insulating interlayer, and top insulation) was ablated using a laser cutter to create a trench that could be used as the vOECT channel. The difference in surface energy between the hydrophobic Teflon coating and the hydrophilic laser cut channel allowed the p($C_4$-T2-$C_0$-EG) to wick into the channel and the remaining material to be dragged away. This method used a picosecond laser, which may lead to local heating and thus damage, as is evident in FIGS. 9A-9B. While the devices may not have provided the clean cuts of a vertical side wall as depicted in the schematic, they yielded operational cofacial pair complementary inverters (FIG. 9C) which operated under the same principles as those in FIGS. 7A-7D. In the case of the self-aligned, laser cut devices variations in device topography and active material thickness likely contributed to the difference in performance between the self-aligned laser-cut and photolithographically defined inverters. Damage to laser cut sidewalls of the channel might change the effective length of the vOECT channels and affect material contact with the source and drain contacts, as opposed to the photolithographically defined channels, which had smoother vertical sidewalls (FIG. 6B). A focused ion beam (FIB) or a shorter pulse duration (ns) laser could be used to reduce these damage effects and lead to cleaner cuts.

Discussion

The concept of a cofacial arrangement of vOECTs presented here enables an ambipolar inverter where the composite vOECTs are co-localized in a manner which allows for a compact geometry. When implemented with vOECTs, the inverter active area (input) spans the same footprint as a single planar OECT. vOECTs not only offer compact geometry, but when compared to pOECTs of the same area and thickness, there is a ten-fold increase in the drain current (FIGS. 6A-6E). Geometric dimensions affect the gain of the inverter, as the gain is directly proportional to $g_m$. Shorter length channels can result in a higher gain, and while the thickness of the channel can be increased to compensate for longer channel lengths, it increases the response time, making it less suitable for electrophysiological recordings.

The ambipolar inverters demonstrated herein using p($C_4$-T2-$C_0$-EG) were not perfectly balanced (n vs. p channel), which can be beneficial in analog applications. Since $V_th$ of the p-type vOECT was higher than the $V_{th}$ of the n-type vOECT, the input voltage at which peak gain occurs was shifted closer to $V_{in}$=0V, which means that the offset required when recording biological signals was smaller, reducing power consumption. In addition, when used as a voltage amplifier, the non-idealities of an ambipolar inverter did not adversely affect its performance.

The developed cofacial vOECT complementary inverter was used as an on-board voltage amplifier to record electrophysiological signals. This single inverter can be used to replace traditional voltage dividers to reduce the overall footprint of the active sensing node. While the cutoff frequency of the inverter is high enough to record low frequency biological signals such as ECG, the geometry can be further modified to reduce response time to ensure no attenuation of higher frequency activity. This includes shorter channel widths and decreasing the thickness of the insulating layer between the source and drain contacts of the vOECTs by reducing PaC thickness or targeting thinner conformal oxide layers in order to achieve shorter vOECT channel length.

The self-aligned, laser-cut cofacial inverter shows that this device is compatible with direct-write fabrication techniques, which is enabled by the relaxed fabrication constraints of OECTs, owing to their bulk transport properties. This fabrication method can address the issue of patterning p- and n-type materials in separate channels when an ambipolar material is not available, owing to the Teflon AF topcoat. This feature allows for separate materials to be dragged and dropped into adjacent trenches of the materials stack. Separate p- and n-type materials may be desirable for digital circuits to ensure the complete switching to the logic level HIGH and LOW, but are not necessary for analog applications. Thus, self-aligning vOECTs for complementary logic gates can be integrated into more complex logic circuits such as decoders, which are typically comprised of hundreds of OECTs and resistors to make up unipolar gates to enhance performance and reduce the overall footprint. To improve the performance and reproducibility of the self-aligned OECTs, excessive local heating and associated damage can be minimized, for example using shorter duration pulses and processing and post-processing conditions for ablation of the particular materials stack in order to enhance the topography of the channels.

Methods

Device Fabrication:

The cofacial inverters were fabricated using a dry peel off process reported previously but will be mentioned here briefly. A more detailed description can be found in R. B. Rashid, et al., *Flexible and Printed Electronics* 5, 014007 (2020); and V. Venkatraman et al., *Advanced Science* 5, 1800453 (2018), the disclosure of which is incorporated herein by reference for the purpose of providing additional description of the fabrication method. To define the first layer of gold, AZnLOF 2035 was spun onto clean microscope slides at 3500 rpm and then baked at 110° C. for one minute. The slides were then exposed to UV light using an MJB4 mask aligner, post exposure baked at 110° C. for one and half minutes and developed in AZ300MIF for 30 seconds. The slides were then placed in an AJA e-beam where 5 nm of Cr and 100 nm of Au were deposited and then left in acetone for liftoff for thirty minutes. A 0.65 μm thick paralyene C (PaC, SCS Coatings) insulation layer was then deposited in the presence of the adhesion promoter A 174 using a SCS Labcoater II. Another gold layer was patterned on top of the insulation layer using the same steps mentioned above. Once the final insulation layer was deposited, an anti-adhesive was spun on and a sacrificial layer of PaC was deposited. To pattern the active sites and contact pads, AZP4620 was spun on at 3000 rpm and baked at 110° C. for two minutes. It was then exposed to UV light using an MJB4 mask aligner and developed in 1:4 AZ 400 K. The slides were then placed in a Samco RIE to selectively etch the PaC using $CHF_3$ and $O_2$.

The polymer p($C_4$-T2-$C_0$-EG) was synthesized following a previously reported protocol. (D. Ohayon et al., Influence of Side Chains on the n-Type Organic Electrochemical Transistor Performance. *ACS Applied Materials & Interfaces.*) Then p($C_4$-T2-$C_0$-EG) was spun on at 900 rpm from a 5 mg/ml solution, and the sacrificial layer was mechanically peeled off leaving the material only in the channel. Standard pOECTs were made using the same steps but without a second gold layer. The laser-patterned self-aligned cofacial pairs were made using the same steps, but a sacrificial PaC layer was deposited on the glass slide first, and after the final insulation layer was deposited onto the second layer of gold, a layer of Teflon AF 2400 was spun onto the slide at 1500 rpm and baked at 210° C. for 20 minutes. Then, using an LCS laser cutter, the channels were cut using a power of 2 W, a frequency of 40 kHz with one repetition. A droplet of p($C_4$-T2-$C_0$-EG) was then pinned onto the Teflon coating and dragged and dropped into the ablated channel (trench). All thickness measurements were performed using a Veeco Dektak-8 stylus profilometer. Cross sectional scanning electron microscopy images were taken using a JEOL 4700F FIB/SEM. First, 20 nm of bulk platinum (Pt) was sputter coated, then 1 μm of local Pt was deposited to prevent ion beam damage. The cross sections were milled using a FIB at 30 kV with currents up to 10 nA. The samples were mounted at 45° and tilted at 20° for SEM imaging at 10 kV. Microscopic images were taken using a Zeiss Scope.A1 and AxioCam 105 color.

Electrical Characterization:

OECT and inverter measurements were made with an NI PXIe 1082 using custom LabView code. In addition, all measurements were done in 0.1 M NaCl using an Ag/AgCl electrode as an external gate. Output curves and transfer curves were collected by using source measuring units (SMUs)(NI PXIe-4143). For the p-type measurements, the output curves were collected using a $V_d$ from 0 to $-0.4$ V and a $V_g$ from 0 to $-0.8$ V, and transfer curves were collected using a constant $V_d = -0.4$ V while varying $V_g$ from 0 to $-0.8$ V. For the n-type measurements, the output curves were collected using a $V_d$ from 0 to 0.4 V and a $V_g$ from 0 to 0.6 V, and transfer curves were collected using a constant $V_d = 0.4$ V while varying $V_g$ from 0 to 0.6 V. Electrochemical Impedance Spectroscopy (EIS) was performed using a potentiostat (Metrohm Autolab) to extract volumetric capacitance (C*). A three-electrode configuration was used with a 10 mV sine wave with offsets from 0.5 to 0.8 V for the p-type direction and $-0.2$ to $-0.5$ V for the n-type direction. The spectra were recorded from 0.1 to $10^5$ Hz. A Randall's circuit (R(R|C)) was fit to the impedance spectra to extract the effective capacitance, which was normalized by film volume to find volumetric capacitance (C*).

The voltage transfer characteristics (VTCs) of the inverter were collected using the SMUs to apply $V_{DD}$ and $V_{in}$ and a digital multimeter (DMM) (NI PXIe-4081) was used to measure $V_{out}$. The VTCs were collected by sweeping $V_{in}$ from 0 to 0.6 V while holding $V_{DD}$ constant at 0.7, 0.75, or 0.8 V. Gain was calculated by taking the derivative of the VTC ($\delta V_{out}/\delta V_{in}$). AC measurements on the inverter were performed by applying an input of 10 mV sinusoidal signal with an offset at the peak gain of the inverter at varying frequencies using the NI PXIe 6363. Stability studies were performed by pulsing $V_{in}$ from 0 to 0.6 V in 5 s intervals using the NI PXIe 6363.

ECG was measured by placing two adhesive 3M dot electrodes right below the clavicle on the right side and left side of the subject. One 3M electrode was wired directly to the Ag/AgCl gate of the inverter (on the benchtop) while the other 3M electrode was wired to a bias (NI PXIe 6363). For comparison, the two 3M dot electrodes were wired directly to the DMM. The signals were acquired at 1 kHz and filtered using a bandstop filter of 55-65 Hz then a bandpass filter of 0.1 to 100 Hz. All ECG measurements were taken in compliance with institutional review board guidelines and with informed written consent before subject participation.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A cofacial vertical organic electrochemical transistor pair comprising:
    a vertically stacked structure comprising:
        a first layer of electrically conducting material;
        a second layer of electrically conducting material; and
        a layer of electrically insulating material separating the first layer of electrically conducting material from the second layer of electrically conducting material;
        a trench extending vertically through the vertically stacked structure, wherein the trench bisects one or both of the first and second layers of electrically conducting material;
    a film of active material in the trench, wherein the film of active material spans the first and second layers of electrically conducting material on a first side of the trench and spans the first and second layers of electrically conducting material on an opposing side of the trench;
    an electrolyte at least partially filling the trench; and
    a gate electrode in contact with the electrolyte.

2. The cofacial vertical organic electrochemical transistor pair of claim 1, wherein the trench bisects the first layer of electrically conducting material and the second layer of electrically conducting material.

3. The cofacial vertical organic electrochemical transistor pair of claim 1, wherein the trench bisects one of the first and second layers of electrically conducting material, but does not bisect the other of the first and second layers of electrically conducting material.

4. The cofacial vertical organic electrochemical transistor pair of claim 1, wherein the layer of electrically insulating material has a thickness of no greater than 2 μm.

5. The cofacial vertical organic electrochemical transistor pair of claim 1, wherein the trench has a width of less than 1000 μm.

6. The cofacial vertical organic electrochemical transistor pair of claim 1, wherein the vertically stacked structure further comprises a second layer of electrically insulating material over the second layer of electrically conducting material.

7. The cofacial vertical organic electrochemical transistor pair of claim 6, wherein the vertically stacked structure further comprises a hydrophobic capping layer over the second layer of electrically insulating material.

8. An electronic circuit comprising the cofacial vertical electrochemical transistor pair of claim 1 as an active component of the electronic circuit.

9. A complementary inverter comprising:
    a vertically stacked structure comprising:
        a first layer of electrically conducting material;
        a second layer of electrically conducting material; and
        a layer of electrically insulating material separating the first layer of electrically conducting material from the second layer of electrically conducting material;
        a trench extending vertically through the vertically stacked structure, wherein the trench bisects the first layer of electrically conducting material, but does not bisect the second layer of electrically conducting material;

a film of active material in the trench, wherein the film of active material spans the first and second layers of electrically conducting material on a first side of the trench and spans the first and second layers of electrically conducting material on an opposing side of the trench;

an electrolyte at least partially filling the trench;

a gate electrode in contact with the electrolyte;

a voltage source connected to the first layer of electrically conducting material on the first side of the trench; and a ground connected to the first layer of electrically conducting material on the second side of the trench.

10. The complementary inverter of claim 9, wherein the active material comprises an ambipolar organic polymer.

11. The complementary inverter of claim 10, wherein the ambipolar organic polymer comprises naphthalene diimide groups and thiophene groups.

12. The complementary inverter of claim 9, wherein the first layer of electrically insulating material has a thickness of no greater than 2 μm.

13. The complementary inverter of claim 9, wherein the trench has a width of less than 1000 μm.

14. The complementary inverter of claim 9, wherein the vertically stacked structure further comprises a second layer of electrically insulating material over the second layer of electrically conducting material.

15. The complementary inverter of claim 14, wherein the vertically stacked structure further comprises a hydrophobic capping layer over the second layer of electrically insulating material.

16. A differential pair comprising:

a vertically stacked structure comprising:
 a first layer of electrically conducting material;
 a second layer of electrically conducting material; and
 a layer of electrically insulating material separating the first layer of electrically conducting material from the second layer of electrically conducting material;

a trench extending vertically through the vertically stacked structure, wherein the trench bisects the first layer of electrically conducting material, but does not bisect the second layer of electrically conducting material;

a film of active material in the trench, wherein the film of active material spans the first and second layers of electrically conducting material on a first side of the trench and spans the first and second layers of electrically conducting material on an opposing side of the trench;

an electrolyte at least partially filling the trench;

a gate electrode in contact with the electrolyte;

a voltage source connected across the bisected first layer of electrically conducting material; and a ground connected to the second layer of electrically conducting material.

17. A method for forming a vertical organic electrochemical transistor, the method comprising:

forming a vertically stacked structure on a support substrate, the vertically stacked structure comprising, from bottom to top:
 a first layer of electrically conducting material;
 a first layer of electrically insulating material over the first layer of electrically conducting material;
 a second layer of electrically conducting material over the first layer of electrically insulating material;
 a second layer of electrically insulating material over the second layer of electrically conducting material; and
 a hydrophobic capping layer over the second layer of electrically insulating material;

forming a trench in a central portion of the vertically stacked structure, the trench extending from the capping layer down through the first layer of electrically conducting material;

depositing a liquid comprising an organic active material in the trench;

evaporating the liquid to form a film of the organic active material in the trench, wherein the film of organic active material laterally spans the width of the trench and vertically spans the first and second layers of electrically conducting material;

filling the trench with an electrolyte; and placing a gate electrode in electrical communication with the organic active material.

18. The method of claim 17, wherein the vertically stacked structure further comprises a third electrically insulating layer between the support substrate and the first layer of electrically insulating material.

19. The method of claim 18, wherein the third electrically insulating material is mechanically flexible and the method further comprises removing the support substrate.

20. The method of claim 17, wherein the trench bisects the first and second layers of electrically conducting material and forms a first vertical organic electrochemical transistor on one side of the trench and a second vertical organic electrochemical transistor on an opposite side of the trench.

21. The method of claim 17, wherein the trench does not bisect the first or second layers of electrically conducting material and forms a single vertical organic electrochemical transistor.

22. The method of claim 17, wherein the trench bisects one of the first and second layers of electrically conducting material, but does not bisect the other of the first and second layers of electrically conducting material.

* * * * *